United States Patent [19]

Seyyedy

[11] Patent Number: 5,734,620
[45] Date of Patent: Mar. 31, 1998

[54] HIERARCHICAL MEMORY ARRAY STRUCTURE WITH REDUNDANT COMPONENTS HAVING ELECTRICALLY ISOLATED BIT LINES

[75] Inventor: Mir Majid Seyyedy, Boise, Id.

[73] Assignee: Micron Technology, Inc., Boise, Id.

[21] Appl. No.: 661,810

[22] Filed: Jun. 11, 1996

Related U.S. Application Data

[63] Continuation of Ser. No. 417,208, Apr. 5, 1995, abandoned.

[51] Int. Cl.[6] ............................................. G11C 13/00
[52] U.S. Cl. ................................. 365/230.03; 365/230.01
[58] Field of Search .......................... 365/49, 189.02, 365/189.04, 189.05, 200, 230.01, 230.03, 230.08, 231, 238

[56] References Cited

U.S. PATENT DOCUMENTS

| | | | |
|---|---|---|---|
| 4,888,732 | 12/1989 | Inoue et al. | 365/51 |
| 4,926,382 | 5/1990 | Sakui et al. | 365/203 |
| 4,970,685 | 11/1990 | Koyanagi | 365/51 |
| 5,088,062 | 2/1992 | Shikata | 365/189.05 |
| 5,274,598 | 12/1993 | Fujii et al. | 365/205 |
| 5,295,101 | 3/1994 | Stephens, Jr. et al. | 365/200 |
| 5,307,471 | 4/1994 | Ishikawa | 365/49 |
| 5,353,255 | 10/1994 | Komuro | 365/203 |
| 5,384,745 | 1/1995 | Konishi et al. | 365/230 |
| 5,386,394 | 1/1995 | Kawahara et al. | 365/208 |
| 5,535,161 | 7/1996 | Kato | 365/200 |
| 5,570,319 | 10/1996 | Santoro et al. | 365/230 |
| 5,600,602 | 2/1997 | Seyyedy | 365/205 |

OTHER PUBLICATIONS

*A 1Gb DRAM for File Applications*, Tadahiko Sugibayashi et al., 1995 IEEE International Solid-State Circuits Conference, Feb. 17, 1995.
*A Flexible Redundancy Technique for High-Density DRAMs*, Masashi Horiguchi et al., IEEE Journal of Solid-State Circuits, vol. 26, No. 1, Jan. 1991.

*Primary Examiner*—Terrell W. Fears
*Attorney, Agent, or Firm*—Schwegman, Lundberg, Woessner & Kluth, P.A.

[57] ABSTRACT

An integrated memory array circuit, such as a DRAM, has a global bit line communicating a global bit line signal with a first electrode of each of a plurality of FET devices. The primary global bit line has a plurality of subarray bit lines. Each subarray bit line communicates a subarray bit line signal with a second electrode of one of the FET devices and with a first electrode of each of a plurality of subarray FET devices. Each subarray FET device has a gate communicating a word line signal with a word line. Each subarray FET device has a second electrode communicating a one bit storage signal with a capacitor. Each subarray FET is activated by a word line signal from a corresponding word line to electrically isolate a corresponding capacitor from its corresponding subarray bit line, or to electrically connect the corresponding capacitor with its corresponding subarray bit line. A device senses and amplifies the global bit line signal and outputs an amplified global bit line signal to a column decode device. A redundancy logic controller implements both row and column redundancy for replacement of defective memory array components by redundant components included in the memory array structure, including redundant global bit line, subarray bit lines, FETs, word lines, and capacitors.

49 Claims, 8 Drawing Sheets

5,734,620

HIERARCHICAL MEMORY ARRAY STRUCTURE WITH REDUNDANT COMPONENTS HAVING ELECTRICALLY ISOLATED BIT LINES

This is a continuation of application Ser. No. 08/417,208, filed Apr. 5, 1995 abn.

BACKGROUND OF THE INVENTION

1. The Field of the Invention

This invention generally relates to semiconductor integrated circuit memory structures and, more precisely, relates to a memory array having global array bit lines each of which is connected hierarchically above a plurality of electrically isolatable subarray bit lines, each subarray bit line being connected hierarchically above a plurality of memory cells, each memory cell being in communication with a corresponding word line, where redundant global bit lines, subarray bit lines, and word lines can be activated to replace defective global bit lines, subarray bit lines, and word lines.

2. The Relevant Technology

In dynamic random access memory chips, bit line capacitance is an important consideration. A reduction in bit line capacitance reduces the amount of power required by the memory cell structure. Attempts have been made to optimize or maintain the overall cell capacitance to bit line capacitance ratio. In the past, efforts to maintain the cell capacitance to bit line capacitance ratio have been made by segmenting the bit line array and by adding more N-sensamps, P-sensamps, and/or more column decodes.

While such additional structure makes progress toward maintenance of the cell capacitance to bit line capacitance ratio, these gains are made at a cost of adding expensive overhead to the memory chip, as well as reducing the efficiency of the memory chip. In addition to the forgoing problems in the prior art, a need exists to improve yield by providing redundant memory array structure components to replace defective memory array structure components. Defects can occur in a variety of ways, such as a foreign particle falling onto a die. It would be an advance in the art to electrically isolate such a defective memory array structure component while replacing the defective component with a properly redundant identical component, as oppose to discarding the entire memory structure.

SUMMARY AND OBJECTS OF THE INVENTION

An object of the invention is to reduce overall power consumption of a memory structure. By reducing the overall bit line capacitance of the memory structure, less power is consumed by the memory structure for a given cell capacitance. The strength of the signal from a bit line is proportional to its capacitance. Where a bit line capacitance is smaller, the signal is stronger. The benefit of a stronger signal is a better signal-to-noise ratio. In a favorable signal-to-noise ratio there is a margin to be operational in extremes of temperature and voltage to ensure a high operational standard of the memory structure.

Another object of the invention is, for a given bit line capacitance, reducing the die size of the memory structure as compared to conventional memory structures. Reducing the die size of the memory structure furthers the objective of miniaturizing the memory structure.

A still further object of the invention is to achieve the forgoing objects while improving yield by providing redundant memory array structure components to replace defective memory array structure components.

In the inventive memory structure, a plurality of memory cells are connected hierarchically below a subarray bit line. At least one subarray bit line is connected hierarchically underneath a global bit line. Each global bit line is connected to both sensamp and column decode circuitry.

Preferably, the inventive design electrically isolates subarray bit lines one from another and from the global bit line. Once a selected subarray bit line is connected to the global bit line, the global bit line is connected to only the nonisolated subarray bit line. This, in turn, reduces the overall capacitance of the bit line because only the capacitance of nonisolated subarray bit lines is added to the overall capacitance of the corresponding global array bit line that is hierarchically thereabove. Further efficiencies are achieved by the sharing of sensamp and column decode devices with multiple global bit lines and subarray bit lines. In the preferred embodiment, a single column decode and dual sensamp devices are shared by two global bit lines, there being a total of 4,096 global bit lines to make up a 4 megabit memory chip.

The inventive memory structure increases memory array efficiency in high density memories by reducing die size for a given cell capacitance to bit line capacitance ratio as compared to conventional memory structures for like bit line capacitance, or alternatively, by reducing power consumption for a higher cell to bit line capacitance ratio. The inventive memory structure can be used on a great variety of memory types, including DRAM, SRAM, flash memory, EPROM, electrical memory structures, and other types of memories.

To optimize the cell capacitance to bit line capacitance ratio, an optimum combination of subarray bit lines can be layered hierarchically underneath global bit lines. By so optimizing, overhead is reduced due to shared use of sensamps and column decode devices by the global bit lines to produce a smaller die size requirement.

The inventive memory structure scheme of subarray bit lines and global bit lines also allows for shared column decode devices to reduce die size. Gains related to reduced die size requirements are achieved, as compared to like bit line capacitance in conventional memory structures by the sharing of sensamp and column decode devices.

The inventive memory structure also provides for redundant global bit lines to replace defective global bit lines, provides redundant subarray bit lines to replace defective subarray bit lines, and provides redundant word lines to replace defective word lines, where the redundant subarray bit lines have identical memory cell and word line components associated therewith as the defective subarray bit lines that they replace.

After a defective memory array structure component is detected using conventional means, a redundancy logic controller deactivates or omits activating the defective memory array structure component while reassigning therefore a redundant memory array structure component. The reassignment elf the redundant memory array structure component is a repair operation logically effected by overhead circuitry that can be accomplished through conventional techniques, such as laser fusing of leads to memory array structure components. The redundancy logic controller controls both column and row redundancy in the inventive memory array structure.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained, a more particular description of the invention briefly described above will be rendered by reference to a specific embodiment thereof which is illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
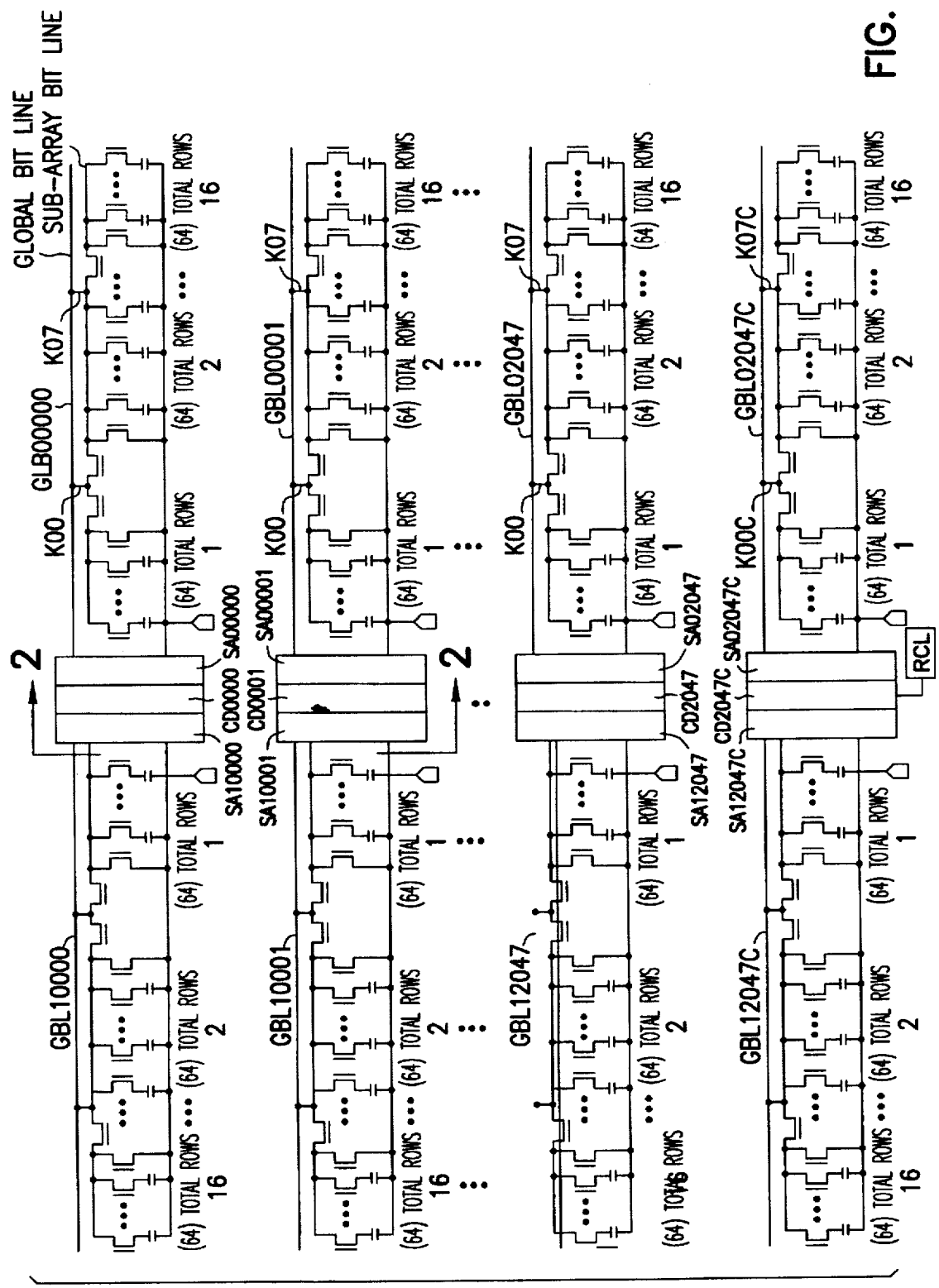
FIG. 1 shows a schematic diagram of a preferred embodiment of the inventive memory array structure as a 4 megabit memory chip having 2,048 columns, each having global bit lines on opposite sides of dual sensamp and column decode circuitry, and also shows multiple redundant columns serving as replacement components for memory array structure components in the 2,048 columns hierarchically thereover.

FIG. 1 shows a schematic diagram of a preferred embodiment of the inventive memory structure. While two global bit lines share a column decode device on each of 2,048 columns, there is a separate sensamp device for each global bit line. The purpose of the sensamp device connected to the global bit lines is to amplify signals on subarray bit lines connected to the global bit lines. The schematic on the left, or secondary, side of the dual sensamp and column decode circuitry is a mirror image of that on the right, or primary, side. The top global bit lines on the first column are, from left to right, GBL1000 and GBL0000. The last global bit lines are, from left to right, GBL 12047 and GBL 02047. This referencing convention shows that there are a total of 4,096 global bit lines in the memory structure shown in FIG. 1.

Figure 2:
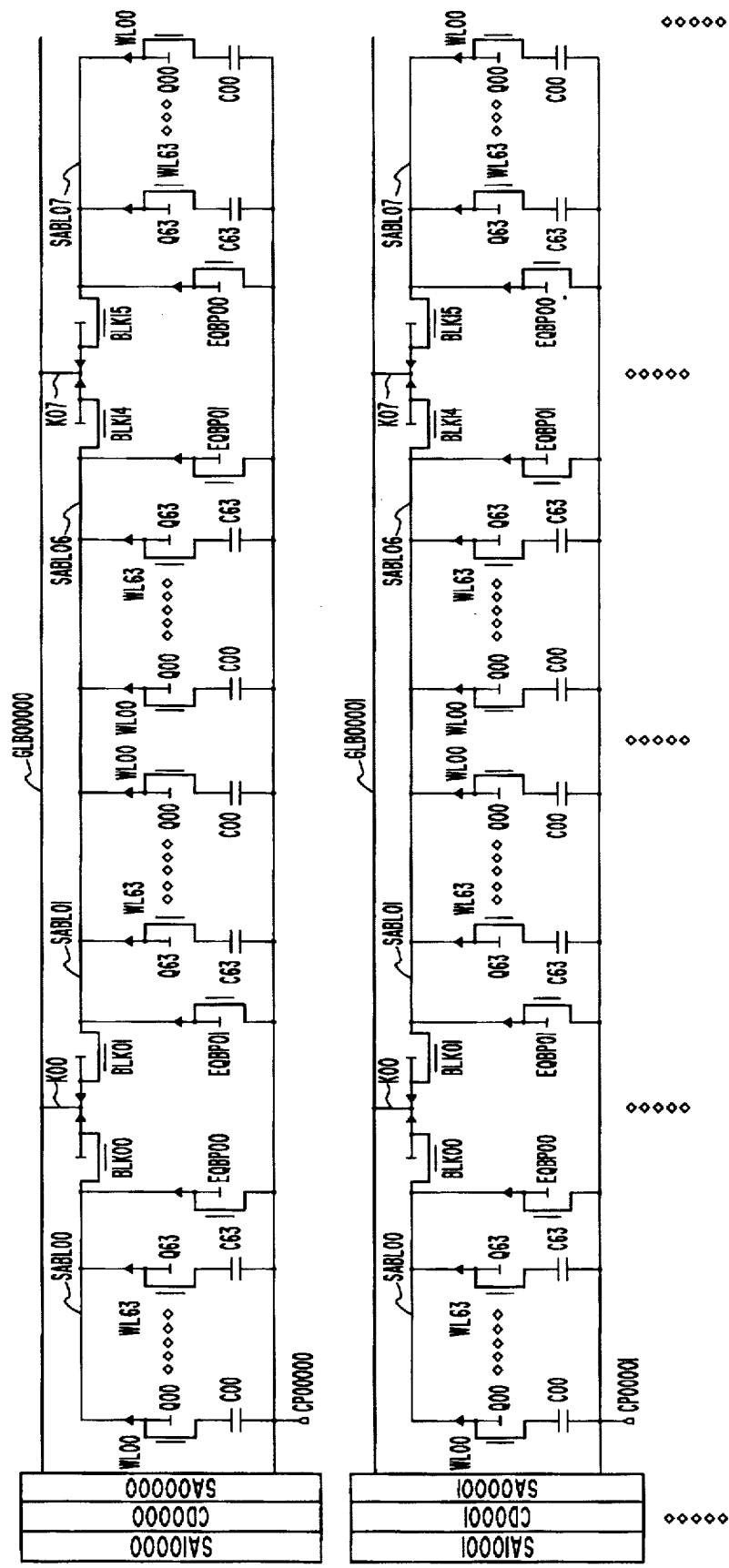
FIG. 2 is an enlarged partial schematic diagram of the inventive memory structure seen in FIG. 1 taken along the 1—1 section line, and particularly shows schematic details of the devices for the connection of two global bit lines, each global bit line being associated by eight contacts with 16 subarray bit lines, and each subarray bit line being associated with 64 word lines.

In the preferred embodiment shown in FIG. 1, each global bit line has eight contacts to its corresponding subarray bit lines which are situated hierarchically under the global bit line. The contacts between each global bit line and its corresponding subarray bit lines are labeled from K00 through K07. Each contact to the global bit line connects two subarray bit lines. FIG. 1 shows a plurality of FETs, each of which has a gate and first and second electrodes, which electrodes function as source or drain regions. Each subarray bit line connects to 64 subarray FETs at a first electrode of each of the 64 subarray FETs. A second electrode of each of the 64 subarray FETs connects to a one-bit capacitor. The gate of each subarray FET in turn is connected to a word line. Through the subarray FET, each subarray bit line is connected hierarchically above 64 word lines. Thus, each global bit line is hierarchically above 16 subarray bit lines and each subarray bit line is hierarchically above 64 word lines, such that the schematic of FIG. 1 shows four megabits or 4,194,304 bits of memory. These four megabits are made up by 2,048 columns, each column having two global bit lines, each global bit line having 16 electrically violatable subarray bit lines having subarray FETs connected to 64 word lines. FIG. 2 is an enlarged view of the upper quadrant of the primary side of FIG. 1 shown from the 2—2 section line seen on the schematic diagram of FIG. 1. FIG. 2 shows global bit line GBL00000 connecting to contacts K00 through K07. Global bit line GBL00000 is stacked over subarray bit line SABL00 through SABL07. By way of example of the subarray structure, subarray bit line SABL00 is connected to global bit line GBL00000 through contact K00. Contact K00 connects to subarray bit line SABL00 through FET controller BLK00. Subarray bit line SABL00 has an equilibrate controller FET shown as EQBP00. The equilibration devices, seen in FIGS. 1 and 2 have EQBP00, EQBP01, etc. are shown as FETs. However, such an equilibration device can be substituted for circuitry in the sensamp devices.

Through a first electrode of a subarray FETs, subarray bit line SABL00 connects to word lines WL00 through WL63 which are connected, respectively, to the gates of the subarray FETs. Word lines WL00-WL63 are respectively connected through the gate of subarray FETs Q00 through 63 to a first electrode of FETs Q00 through Q63 all of which are connected to subarray bit line SABL00. Each word line WL00 through WL63 is associated, respectively, to capacitors C00 through C63, via the gate of subarray FETs Q00 through Q63. Each capacitor C00 through C63 serves as an example and illustration of a means for storing and communicating a storage signal. The capacitor opposite the subarray bit line SABL00 shows connection to a cell plate indicated by CP00000. The cell plate is a blanket-like structure covering most of the memory structure. Holes are positioned on the cell plate through which contact is made with N$^+$ active areas by the subarray bit lines.

In FIG. 1, each sensamp device represents, by way of example and illustration, a means for sensing and amplifying the signal on the corresponding global bit line, and for outputting an amplified global bit line signal to a corresponding column decode device. Here, the column decode device represents, by way of example and illustration, a means for decoding the amplified global bit line signal.

FIG. 1 shows a representation of a plurality of redundant columns which are generally labeled with redundant components as follows: a primary sensamp device SA02047c, a secondary sensamp device SA12047c, the primary and secondary sensamp devices sharing a redundant column decode device CD2047c, a primary global bit line GBL02047c, and a secondary global bit line GBL12047c. In the case of each reference numeral associated with the redundant memory array structure components, the "c" represents at least one redundant memory array structure component. Thus, it is contemplated that multiple redundant columns having associated redundant components are represented by FIG. 1.

FIG. 1 also shows a redundancy logic controller RCL which, through conventional means, receives input as to the detection of a defective memory array structure component, and then either deactivates or omits activating the defective memory array structure component while reassigning therefore a redundant memory array structure component. By way of example, and not by way of limitation, when a primary global bit line is detected to be defective, an unreassigned primary redundant global bit line on a redundant column is logically reassigned to take the place of the defective global bit line. When a secondary subarray bit line is detected to be defective, a secondary redundant global bit line having at least one unreassigned secondary redundant subarray bit line thereunder, a unreassigned secondary redundant subarray bit line, and a secondary redundant column hierarchically thereover are logically reassigned by logic controller RCL to take the place of the defective primary subarray bit line. Finally, when a defect is detected in a memory cell, or a access device associating a memory cell with a corresponding word line, the subarray bit line associated with the defect is either deactivated or is omitted from activation along with its associated components, and a redundant global bit line having at least one unreassigned redundant subarray bit line, a unreassigned redundant subarray bit line with its associated component memory cells and access devices, and the redundant column hierarchically thereover are all logically reassigned by logic controller RCL to take the place of the subarray bit line associated with the defect. Preferably, each of the redundant subarray bit lines hierarchically under any one redundant column is reassigned before the next redundant column is used for redundant structures hierarchically thereunder. In this way, the use of redundant components in redundant column is efficient.

Logic controller RCL represents, by way of example and illustration, a means for activating one of the subarray bit lines in a redundant column corresponding to one of the subarray bit lines in the nonredundant column. Logic controller RCL also represents, by way of example and illustration, a means for storing addresses of the activated one of the redundant subarray bit lines.

The benefit realized by the redundancy aspect of the inventive memory array structure is that the failure of a memory cell, access device, subarray bit line, or sensamp device, does not require that an entire column be discarded as unusable. For example, when a primary global bit line on the primary side of a column is defective, the column decode device and the secondary side of the column, assuming no defects in the secondary global bit line thereof, are still usable. By preserving as much of each column in the hierarchy thereof that is nondefective, yield in manufacturing is improved so as to realize cost savings through lower rejection rates.

The cell plate and each global bit line are connected to a separate sensamp device. As shown in FIG. 2, global bit lines GBL00000 and GBL00001 are connected, respectively, to sensamp devices SA00000 and SA00001. Column decode devices CD0000 and CD00001 are associated, respectively, with global bit lines GBL00000 and GBL00001. Each column decode device interfaces with dual sensamp devices. Thus, an efficient use of the global bit lines exists through sharing of sensamp and column decode circuitry to interface with the word lines of multiple subarray bit lines.

Each word line is in electrical communication with a corresponding word line in each of the 2,048 columns seen in FIG. 1. Thus, there are 2,047 other word lines in electrical communication with each word line. The electrical communication between word lines, while not seen in FIGS. 1 and 2, is accomplished by interconnections between each gate of each subarray FET associated with the corresponding word lines. As seen in FIG. 2, the subarray FETs associated with the word lines are Q00 through Q63 for each subarray bit line. By way of illustration of such correspondence of word line interconnection, each gate of each subarray FET Q00 of each subarray bit line SABL00 of global bit lines GBL00000 through GBL02047 are electrical connected together. Similar interconnection conventions apply for the gates of subarray FETs Q01 through Q63 in each of the 2,048 columns seen in FIG. 1.

While FIGS. 1 and 2 depict a shared column decode device between sensamp devices, it is also contemplated that the column decode device need not be shared by sensamp devices. It is contemplated within the scope of the present invention that a column decode device can be separated from both the sensamp devices and global bit lines.

Figure 3:
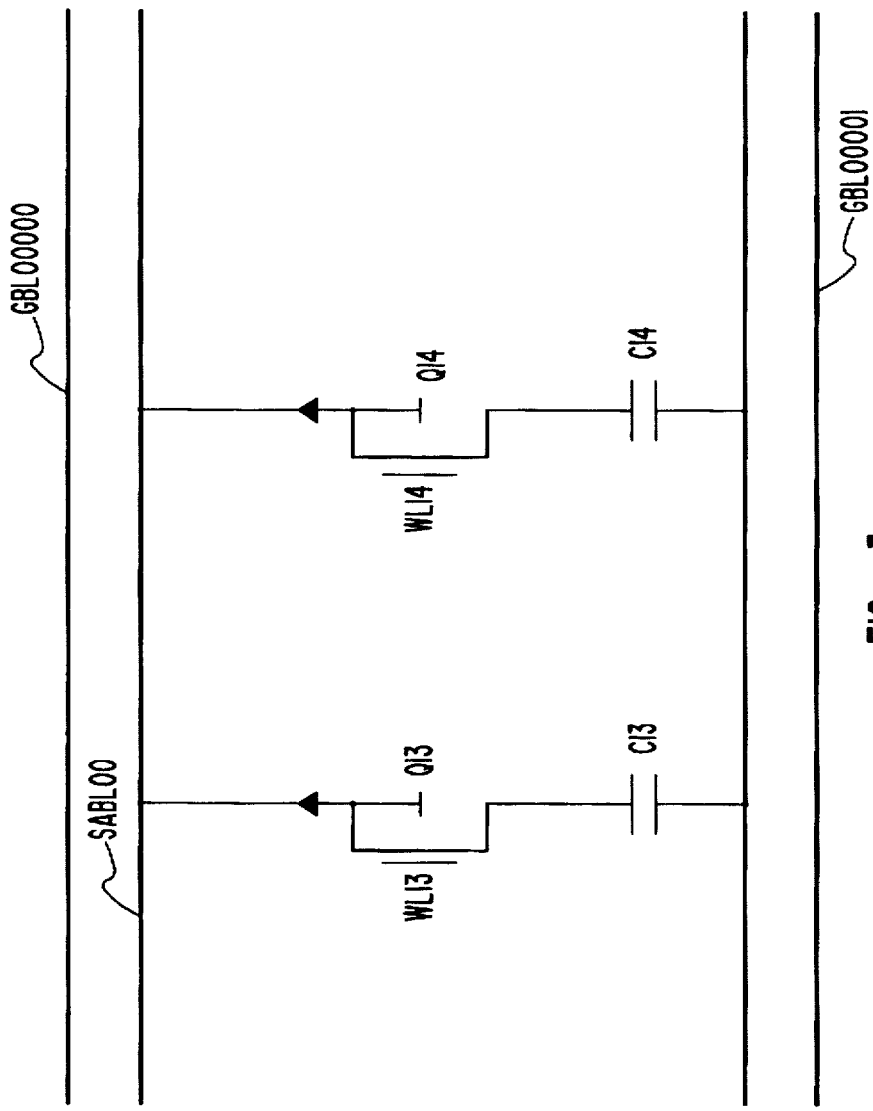
FIG. 3 shows an enlarged partial schematic diagram of the memory structure seen in FIG. 2 taken along the 3—3 section line, and particularly shows the area of the memory structure having two word lines and their associated subarray bit lines.

FIG. 3 is an enlarged sectional view of the schematic diagram in FIG. 2 shown along the 3—3 section line of FIG. 2. In FIG. 3, word lines WL13 and WL14 are shown, respectively, by connection to the gate of subarray FETs Q13 and Q14, which are respectively associated with capacitors C13 and C14. Subarray bit line SABL00 is hierarchically above subarray FETs Q13 and Q14 through connection to a first electrode of subarray FETs Q13 and Q14. SABL00 is stacked below global bit line GBL00000. FIG. 3 schematically depicts two of the 64 word lines associated with subarray bit line SABL00.

Figure 4:
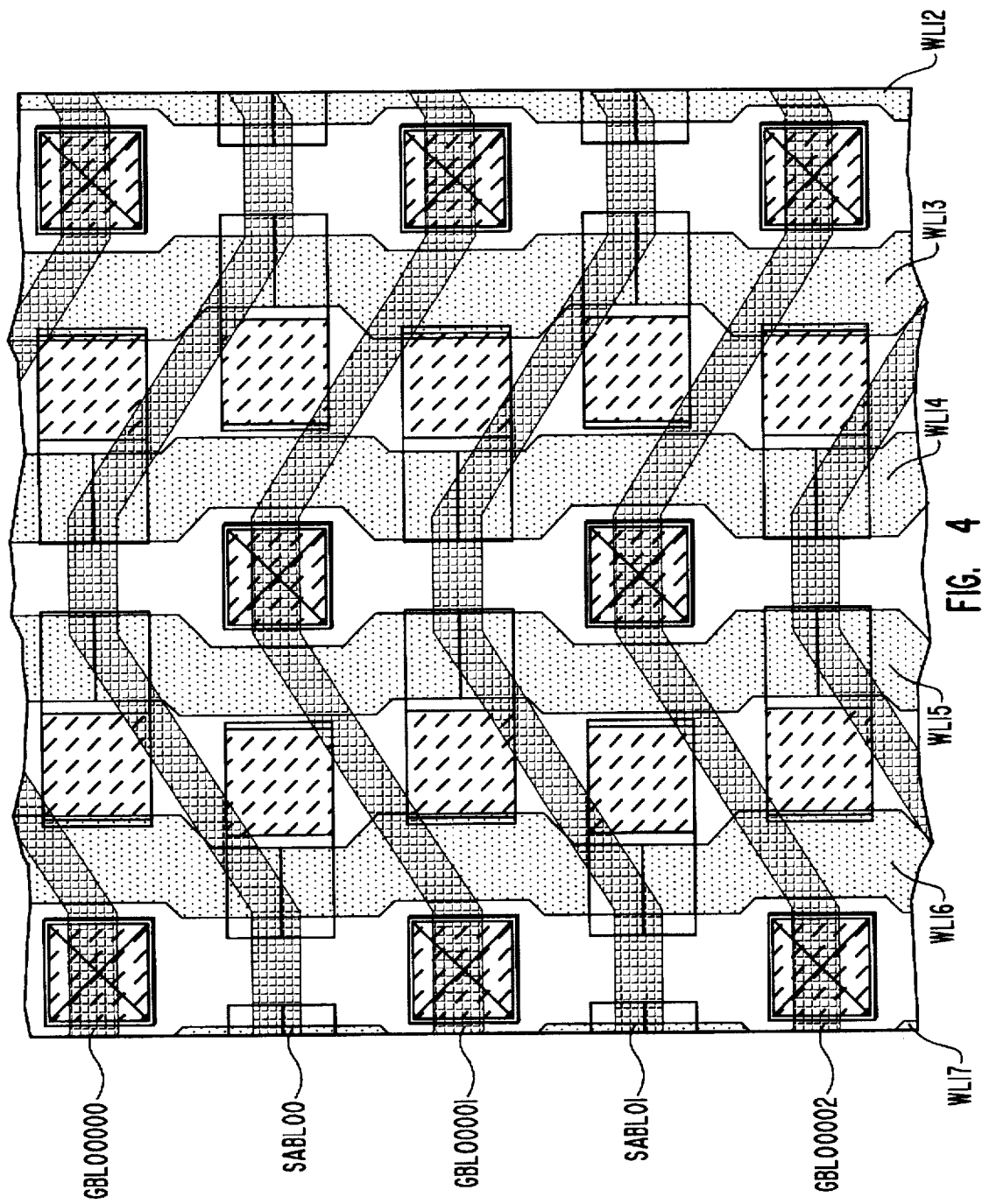
FIG. 4 is an overview of a preferred embodiment of the inventive memory structure in FIG. 2 taken during the 4—4 Section line, which is shifted from the 3—3 Section line, and shows a subarray bit line making contact with N$^+$ active regions, each of which is associated with a word line, which subarray bit line is paralleled both above and below by a global bit line.

FIG. 4 shows a partial and enlarged layout of a preferred embodiment of the inventive memory structure seen in FIG. 2 along the 4—4 section line in which there are pictured two global bit lines, one subarray bit line, and eight word lines. The global bit line and the subarray bit line are seen on a single layer of conductive material. FIG. 4 is shown with several layers removed for simplicity. Subarray bit line SABL00 is stacked in between global bit lines GBL00000 and GBL00001. Running perpendicularly to subarray bit line SABL00 are word lines WL12 through WL19. Subarray bit line SABL00 connects to an $n^+$ active area associated with a word line at each "X" seen in FIG. 4. Neither of the two global bit lines seen in FIG. 4 are connected to an $N^+$ active area. Word lines WL12 through WL19 are preferably composed of polysilicon. It is preferable that each global bit line and subarray bit line is made of a electrically conductive material, such as a metal.

Because of the staggering of the layout diagram depicted in FIG. 4, there is the appearance that only two word lines are situated in between contacts with subarray bit line SABL00. However, without the depicted staggering view seen in FIG. 4, four word lines would be seen between each contact with subarray bit line SABL00, as to be described with respect to FIG. 6 hereinafter.

In an alternative embodiment of the inventive memory structure not seen in FIG. 4, the global bit line and the subarray bit line are on separate conductive layers, such as separate metal layers, and an oxide layer separates the conductive layer of the global bit line from the conductive layer of the subarray bit line.

Figure 5:
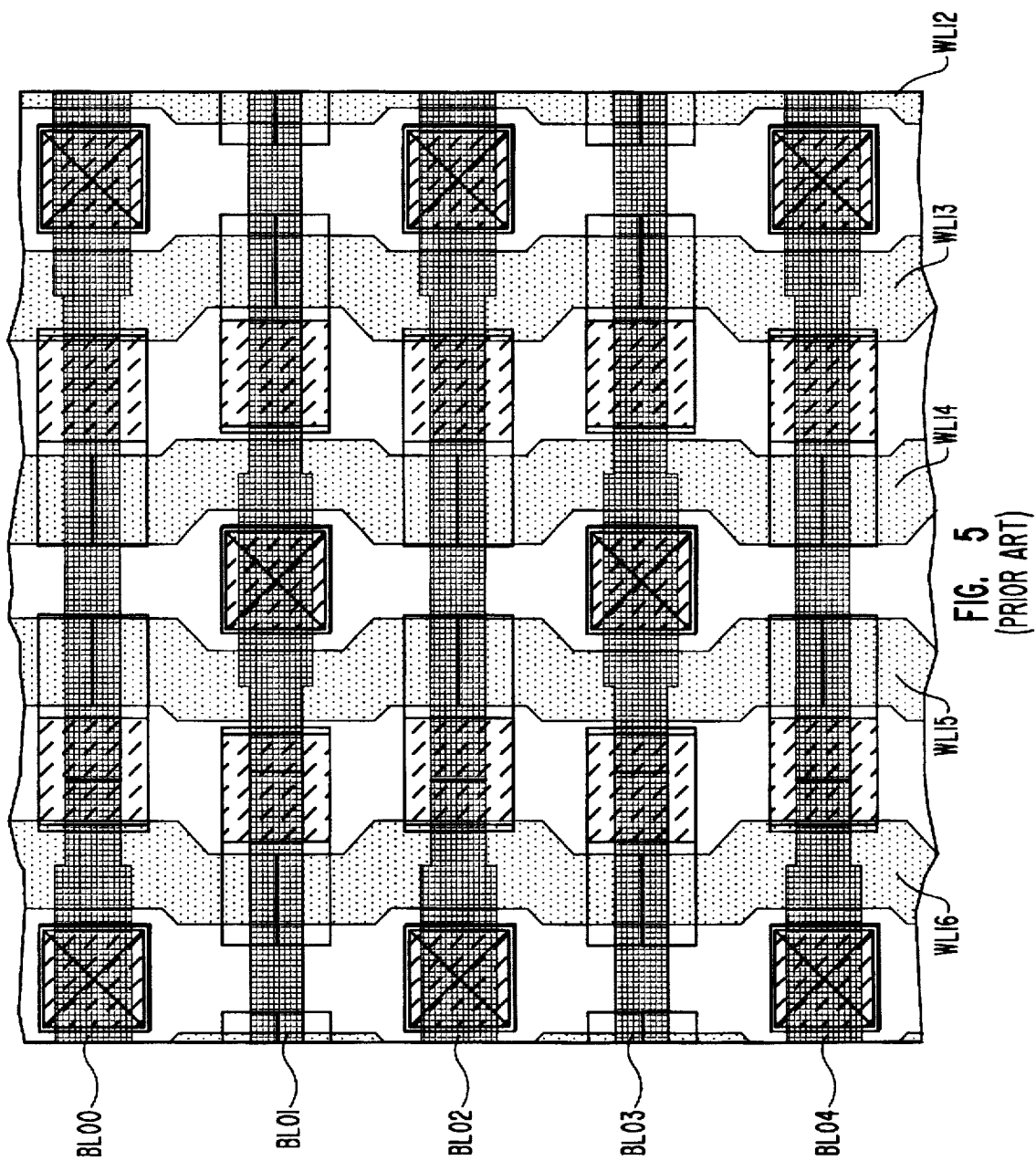
FIG. 5 shows a prior art memory structure in which 5 bit lines are in contact with five word lines.

FIG. 5 depicts a prior art memory array structure where no subarray bit lines are featured. Rather, each bit line BL00 through BL04 contacts each word line WL12 through WL16. The place of contact is seen by a "X" on FIG. 5 where each bit line BL00 through BL04 makes contact with an $N^+$ active area associated with a word line WL12 through WL16. As can be seen in FIG. 5, there are four word lines in between each point of contact with each bit line.

Figure 6:
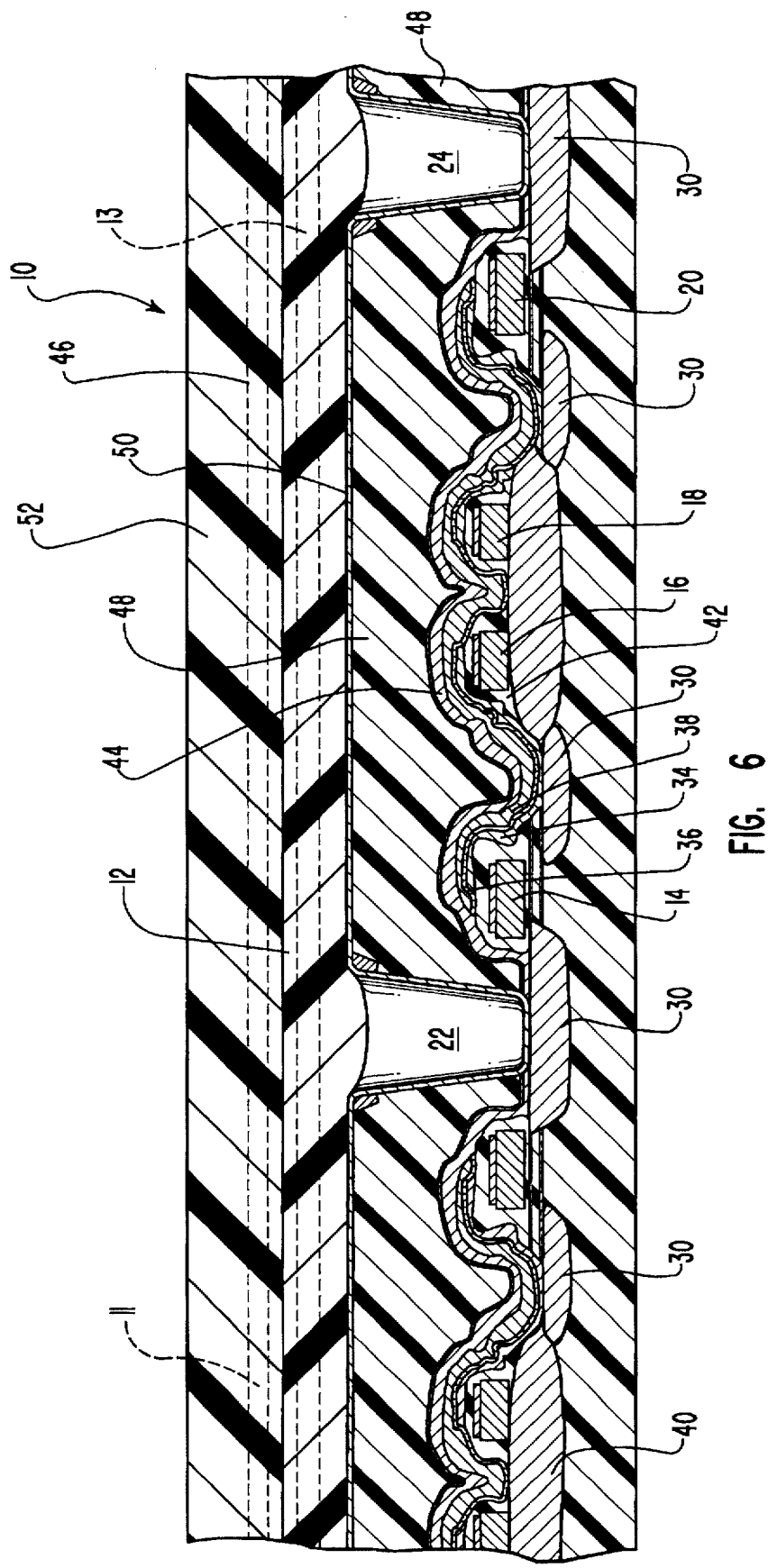
FIG. 6 is a cross-section side elevational view of a portion of a preferred embodiment of the inventive memory structure showing a subarray bit line making a vertically oriented contact with an N$^+$ active region on opposite sides of four word lines, each pair of word lines having a capacitor region therebetween, and some word lines have an N$^+$ active area on each side thereof, where those word lines and the dual N$^+$ active areas on opposite sides thereof form a transistor.

FIG. 6 shows a cross-sectional side elevational view of a preferred embodiment of the inventive memory structure, where four word lines are situated between two contacts with a subarray bit line, which contacts are also electrically connected to an $N^+$ active area. While FIG. 6 shows only a portion of a preferred embodiment of the inventive memory structure, the layered nature of the structure is that metallic bit lines are disposed over a layer of BPSG. The layer of BPSG is disposed over a polysilicon layer of top cell plate which covers over a layer of cell dielectric. Under the layer of cell dielectric is a series of polysilicon storage nodes. Each storage node connects with a buried contact which connects to an $N^+$ active area forming a fragmented bottom layer of the memory structure. Polysilicon word lines are positioned in between the buried contacts and the $N^+$ active areas. Contact fill segments extend through the layer of BPSG, the layer of top cell plate, the cell dielectric layer, around the storage nodes, around the buried contacts, and around the word lines so as to form a contact from the bit lines to the $N^+$ active areas.

A portion of the inventive memory array structure is generally shown at 10 in FIG. 6. A subarray bit line 12 is seen as being situated on the same conductive layer with a global bit line 11 shown in phantom. In an alternative embodiment not shown, a global bit line 13 can be stacked above subarray bit line 12 on a separate conductive layer. Word lines 14, 16, 18, 20 are seen positioned between a pair of contact fills 22 and 24.

$N^+$ active regions are shown at reference numeral 30. A capacitor is illustrated as a cell dielectric 36 surrounded by a top cell plate 36 and storage node 34. A field oxide is seen at 40, and oxides are seen at 42, 44, and 46. A layer of BPSG 48 is situated between contact fills 22, 24. A barrier 50 is immediately below subarray bit line 12. A layer of nitride passivation 52 is situated above oxide layer 46.

A transistor is made up by two $N^+$ active areas on either side of word lines 14, 16, 18 and 20 which are preferably polysilicon word lines. A capacitor, composed of storage node 34 having cell dielectric 36 that is covered over by top cell plate 38, is seen on the right side of each word line and immediately above each $N^+$ active area.

Figure 7:
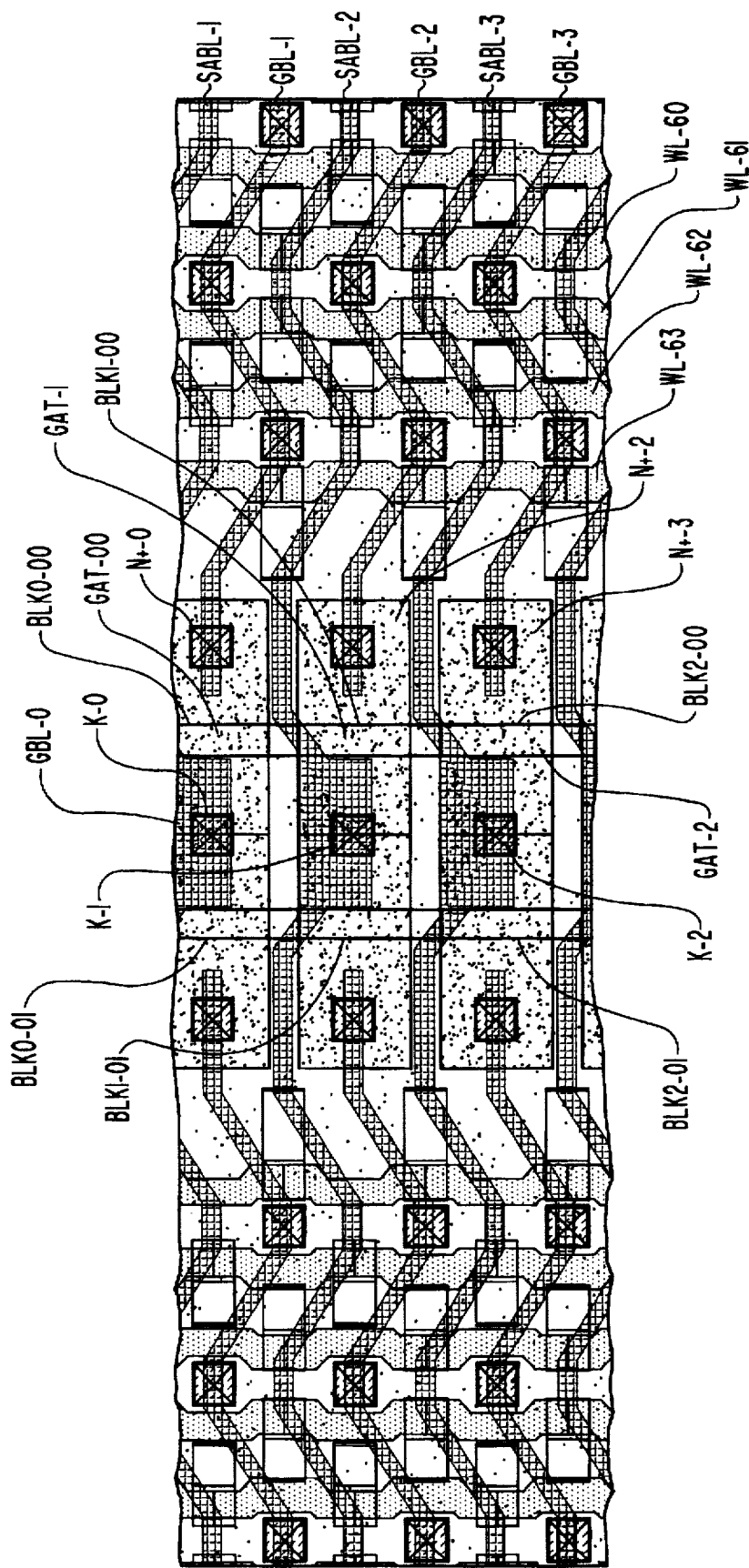
FIG. 7 is an overview of a preferred embodiment of the inventive memory structure showing subarray bit lines, and also showing global bit lines each of which makes contact with two N$^+$ active areas in between the start of one subarray bit line and the end of another subarray bit line.

FIG. 7 is a depiction of the areas of contact between a global bit line and its corresponding subarray bit lines. Contact areas K-0, K-1, and K-2 are contacts, respectively, from global bit lines GBL-0, GBL-1 and GBL-2 to $N^+$ active areas associated with subarray bit lines that correspond, respectively to FETs BLK0-01, BLK0-00, BLK1-01, BLK1-00, BLK2-01, and BLK2-00. Each contact K-0, K-1, and K-2 has two corresponding FETs. Global bit line GBL-0 has corresponding FETs BLK0-01 and BLK0-00. Contact K-1 associated with global bit line GBL-1 has corresponding FETs BLK1-01 and BLK1-00. Contact K-2 associated with global bit line GBL-2 has corresponding FETs BLK2-01 and BLK2-00.

A gate is depicted for each of the six FETs BLK0-00, BLK0-01, BLK1-00, BLK1-01, BLK-2-01, and BLK-2-00. By way of example, FET BLK0-00 has gate GAT-0 associated therewith, FET BLK1-00 has gate GAT-1 associated therewith, and FET BLK2-00 has gate GAT-2 associated therewith. The contacts K-0, K-1, and K-2 with their corresponding FETs establish connection between global bit lines and the subarray bit lines hierarchically thereunder. In FIG. 7, both the subarray bit lines and the global bit lines are on the same conductive layer. In other preferred embodiments of the inventive memory array structure, the subarray bit lines and the global bit lines can be on different conductive layers.

An advantage gained by the invention, which advantage can be understood by the example of the circuitry depicted in FIGS. 4 and 7, is that subarray bit lines are electrically isolated at a constant voltage while the global bit line therebetween is operational. In so doing, the voltage of the global bit line is not effected by with the two subarray bit lines that are adjacent to the global bit line, and the bit line coupling component between adjacent bit lines is not hindered. By holding subarray bit line voltage constant, the effect of bit line coupling capacitance is reduced, as compared to conventional bit line structures where voltage is not held constant on adjacent bit lines. Thus, the electrical isolation of subarray bit lines that are adjacent to a global bit line prevents interference with the voltage on the global bit line.

The inventive memory structure electrically isolates subarrays from causing a moving effect upon the voltage of a corresponding global bit line. This electrical isolation is effected by connecting only a selected subarray bit line, and its associated memory cells, to a global bit line at a time. Unlike conventional memory structures which connects all memory cells to the bit lines simultaneously, the inventive memory array structure permits that only some of the memory cells are connected to a global bit line through access devices associated with a select subarray bit line at a time.

Electrical isolation of the subarray bit lines adjacent to a global bit line acts to block capacitance interference with the global bit line and reduces the noise effect of bit line coupling components known to conventional memory structures lacking such adjacent bit line isolation. As can be seen in FIGS. 4 and 7, the interleaving of electrically isolated subarray bit lines with global bit lines, where the global bit lines does not contact the $N^+$ active area except at periodic points of contacts, enables an electrical blocking effect due to the electrical isolation of the subarray bit line adjacent to a global bit line.

The bit line coupling component is 15% of the overall bit line capacitance between adjacent bit lines, or a total of 30% of the capacitance for a bit line having two adjacent bit lines. The inventive memory array structure, by electrically isolating subarray bit lines, effectively reduces the bit line capacitance by about 70%. The absence of an electrical barrier for adjacent bit lines in conventional memory structures is detrimental, in that conventional memory structures connect all memory cells to the bit lines simultaneously, which causes about a 70% higher bit line coupling component. By reducing the bit line coupling component by about 70% through electrical isolation of adjacent subarray bit lines in the inventive memory array structure, there is a marked improvement in the global bit line signal strength. As seen in FIGS. 4 and 7, the patterning of the memory structure combined with the electrical isolation of subarray bit lines adjacent to a global bit line, furthers the objective of a higher signal to noise ratio.

The isolation of subarray bit lines from global bit lines is an important factor in reducing capacitance of the memory structure because on each cycle of read or write operations these capacitors must be charged and discharged. By reducing the global bit line capacitance, there is a concomitant reduction in the power consumption. While a conventional memory structure connects all capacitors therein simultaneously, only selected capacitors are connected within the inventive memory structure. The capacitance coupling component between bit lines is much smaller due to the smaller segmenting of the connections therebetween. For each small segment of word lines activating FETs to connect selected memory cells to their corresponding global bit lines that are hierarchically connected thereover, the overall capacitance is less than conventional bit lines having all of its memory cells connected thereto simultaneously. The global bit line, once connected to a selected subarray bit line, only senses the capacitance between the immediately adjacent two subarray bit lines. Due to this isolation of subarray bit lines, the global bit line does not sense the isolated and unconnected subarray bit lines so that the overall capacitance of the global bit line is reduced.

For a given bit line capacitance, the die size of the memory structure is smaller than conventional memory structures because in the inventive structure sensamp and column decode devices are shared by or among more memory cells, thus using less overhead circuitry.

Figure 8:
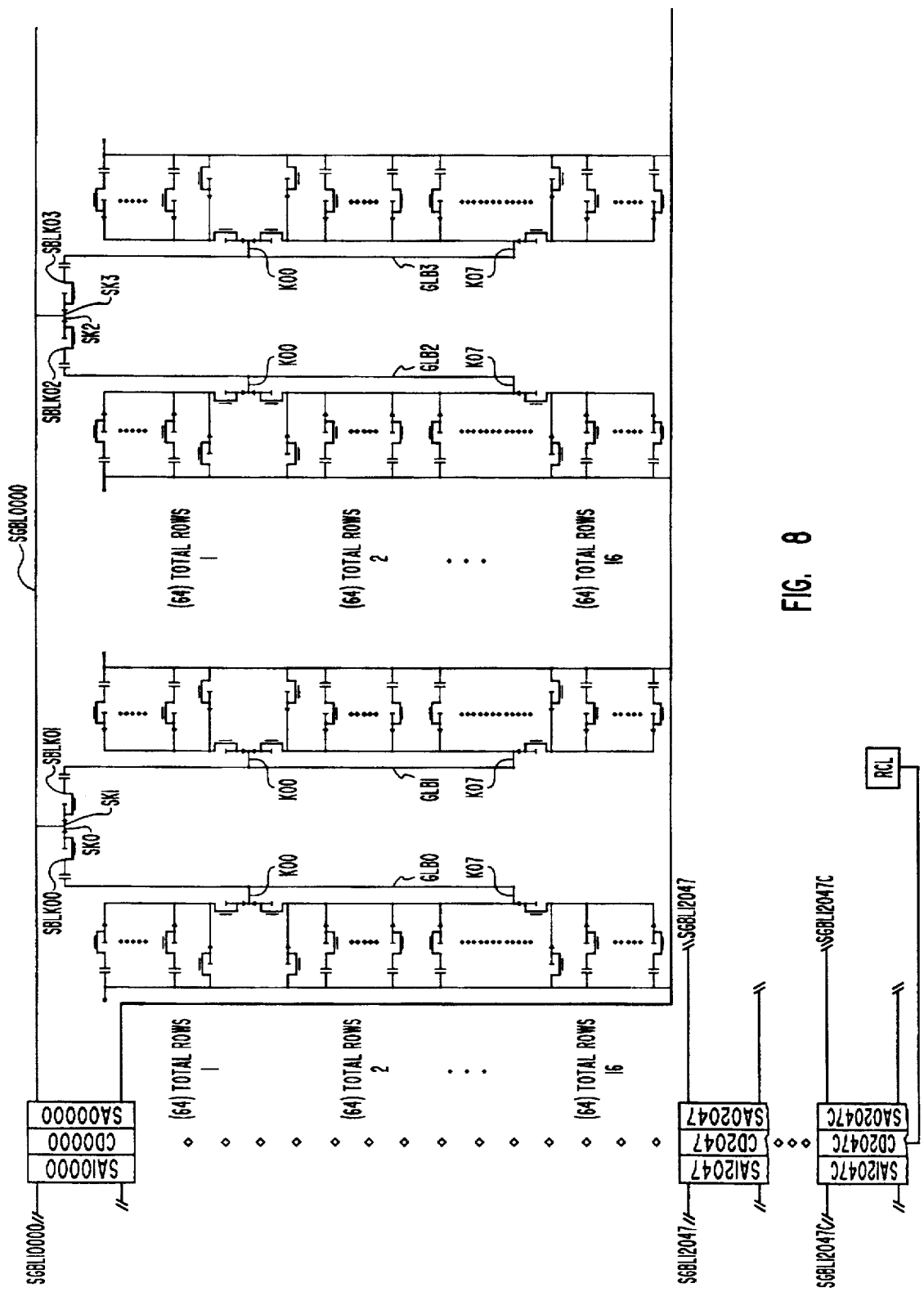
FIG. 8 shows a schematic diagram of another preferred embodiment of the inventive memory array structure as a 16 megabit memory chip having 2,048 columns, each having superglobal bit lines on opposite sides of dual sensamp and column decode circuitry, and also shows multiple redundant columns serving as replacement components for memory array structure components in the 2,048 columns hierarchically thereover.

Another preferred embodiment of the invention is shown in FIG. 8 where, by way of example, a superglobal bit line SGBL00000 is hierarchically above four global bit lines GBL0, GBL1, GBL2, GBL3 through four FETs SBLK00, SBLK01, SBLK02, SBLK03. Each global bit line can be electrically isolated from its corresponding superglobal bit line similar to the electrical isolation of subarray bit lines from adjacent global bit lines as is described herein with respect to FIGS. 1–4, 6 and 7. One global bit line is interfaced through a FET associated between the unisolated global bit line and its corresponding superglobal bit line.

In FIG. 8, there are 2,048 columns, each column having two superglobal bit lines connecting to dual sensamp devices which in turn share a column decode device. Each of the two superglobal bit lines have four contacts to four global bit lines, which contacts are similar to those described herein with respect to FIG. 4. As in FIGS. 1 and 2 and text herein associated therewith, each global line in the alternative preferred embodiment has 8 contacts to 16 subarray bit lines. Correspondingly, each subarray bit line has contacts to 64 word lines through a first electrode of each of 64 subarray FETs. Additionally, each word line actives through a subarray FET gate to connect a second electrode of the 64 subarray FETs to a means for storing a one bit charge, such as a capacitor. In such an embodiment of the invention, a 16 megabit memory array is accomplished.

While superglobal bit lines and global bit lines are intended to be connected through FET devices, the number of global bit lines to be connected through FETs to a superglobal bit line is contemplated to vary within the scope of the invention. Additionally, the superglobal bit line is contemplated to be on a different conductive layer than the global lines associated therewith, where the subarray bit lines and the global bit lines can be on the same or on different conductive layers. Thus, embodiments of the inventive memory array structure incorporating superglobal bit lines can have two or three conductive layers for the superglobal bit lines, the global bit lines, and the subarray bit lines.

FIG. 8 also depicts a redundancy schematic having a scheme that functions similarly to the redundancy scheme of FIG. 1. In FIG. 8, there is shown a representation of a plurality of redundant columns which are generally labeled with redundant components as follows: a primary sensamp device SA02047c, a secondary sensamp device SA12047c, the primary and secondary sensamp devices sharing a redundant column decode device CD2047c, a primary superglobal bit line SGBL02047c, and a secondary superglobal bit line SGBL12047c. In the case of each reference numeral associated with the redundant memory array structure components, the "c" represents at least one redundant memory array structure component. Thus, it is contemplated that multiple redundant columns having associated redundant components are represented by FIG. 8.

FIG. 8 also shows a redundancy logic controller RCL which, through conventional means, receives input as to the detection of a defective memory array structure component, and then either deactivates or omits activating the defective memory array structure component, while reassigning therefore a redundant memory array structure component. By way of example, and not by way of limitation, when a secondary superglobal bit line SGBL00001 is detected to be defective, a redundant secondary superglobal bit line SGBL02048 on redundant column 2049 is logically reassigned to take the place of defective secondary superglobal bit line SGBL00001. Similarly, when a primary global bit line is detected to be defective, a redundant primary superglobal bit line having at least one unreassigned primary redundant global bit line, and an unreassigned primary global bit line on a redundant column hierarchically thereover are logically reassigned to take the place of the defective global bit line. When a subarray bit line is detected to be defective; an unreassigned redundant subarray bit line, a redundant global bit line hierarchically thereover, and a redundant superglobal bit line on a redundant column are all logically reassigned by logic controller RCL to take the place of the defective subarray bit line. Finally, when a defect is detected in a memory cell, or a access device associating a memory cell with a corresponding word line, the subarray bit line associated with the defect is either deactivated or is omitted from activation along with all memory cells and access devices associated therewith, and an unreassigned redundant subarray bit line with its corresponding memory cells and access devices, a redundant global bit line heirarchically thereover, and a redundant superglobal bit line heirarchically thereover on a redundant column are all logically reassigned by logic controller RCL to take the place of the subarray bit line associated with the defect. Preferably, each of the redundant subarray bit lines heirarchically under any one redundant column is reassigned before the next redundant column is used for reassigning memory components thereunder. In this way, the use of redundant components in each redundant column is efficient.

The inventive memory array structure is contemplated to be used in a variety of memory types, each of which incorporates a plurality of access devices into the memory array structure of the memory type. The access devices are FETs in a DRAM embodiment, an example of which is a subarray FET that is activated by a word line signal from a word line to connect a capacitor to a subarray bit line through the subarray FET, and where other FETs selectively isolate or connect the subarray bit lines to global bit lines. In the case of SRAM, the access devices may be two FETs. In the case of flash memory, each access device may have a transistor with a floating gate while the memory cell forms a part of the access device itself.

For each memory type, the function of the access device is to serve as an electrical switch. As an electrical switch, each access device is capable of electrically isolating lines or devices that are connected to the access device. Alternatively, the access device is capable of electrically communicating a signal between lines or devices that are connected to the access device. Thus, access devices are capable of electrically isolating subarray bit lines from a corresponding global bit line, and electrically isolating both word lines and corresponding storing and communicating means.

In a still further preferred embodiment of the invention, which also can be seen in both FIGS. 1 and 8, it is contemplated that each subarray bit line has allocated some of the capacitors and subarray FETs to be redundant and has allocated the other capacitors and subarray FETs to be non-redundant and replaceable if defective by those that are redundant. By way of example of the 64 component sets on each subarray bit line, thirty-two of the capacitors, subarray FETS, and word lines are memory array structure components, while the other thirty-two of the capacitors, subarray FETs, and word lines are replacement memory array structure components. Thus, if one word line in the main thirty-two word lines becomes defective, a replacement word line, subarray FET, and associated capacitor is assigned to replace this defect within the same subarray bit line in the same column so as to repair the word line in that column. In this embodiment of the invention, each word line is in electrical communication with a row decode driver device, which is represented by redundancy logic controller RCL. Redundancy logic controller RCL also represents both logic and hardware circuitry to repair the defective word line by reassigning a redundant word line and associated redundant capacitor in the same subarray bit line and the same column. Through conventional means, redundancy logic controller RCL receives input as to the detection of a defective word line, and then either deactivates or omits activating the defective word line while reassigning therefore a redundant word line and associated redundant capacitor. Thus, redundancy logic controller RCL performs the function of effecting repairs to the inventive memory array structure by controlling column redundancy, row redundancy, or both column and row redundancy.

In yet a further preferred embodiment of the invention, replacement subarray bit lines with associated replacement access devices and replacement memory cells are provided in the same side of the column to replace defective subarray bit lines and associated components within the same column. These replacement components within the same column can be combined with the column and row redundancy structures described above. In each of such embodiments of the invention, the redundancy logic controller controls the replacement of defective components and the storage of memory addresses necessary to logically effect such replacement.

In summary, for a fixed bit line capacitance the inventive memory structure is smaller in die size than convention memory structure die sizes by the provision of the inventive subarray bit lines structure with shared column decode devices between dual sensamps. Alternatively, by providing a plurality of word lines for each subarray bit line, and electrically isolatable subarray bit lines for each global bit line via access devices, a reduced effect on bit line capacitance is realized because the bit line capacitance component is reduced by connecting only selected memory cells at any one time. As the bit line capacitance component is reduced, there will also be a reduced power consumption for the memory structure because less power is needed to charge the unisolated parts of the memory array structure. Finally, the incorporation of row and column redundancy and replacement components effect an increase in manufacturing yield.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. An integrated memory array circuit comprising:
   a) a primary global bit line communicating a primary global bit line signal with each of a corresponding plurality of primary access devices, said primary global bit line having a corresponding plurality of primary subarray bit lines, each one of said plurality of primary subarray bit lines being made electrically isolatable from and electrically communicable to said primary global bit line by one of said plurality of primary access devices, each one of said plurality of primary subarray bit lines communicating a primary subarray bit line signal with one of said plurality of primary access devices and with each of a corresponding plurality of primary subarray access devices, each one of said plurality of primary subarray access devices being capable of both electrically isolating and electrically communicating a primary storage signal with a primary means for storing and communicating said primary storage signal;
   b) a primary means for sensing and amplifying said primary global bit line signal, and for outputting an amplified primary global bit line signal;
   c) a primary redundant global bit line communicating a primary redundant global bit line signal with each of a corresponding plurality of primary redundant access devices, said primary redundant global bit line having a corresponding plurality of primary redundant subarray bit lines, each one of said plurality of primary redundant subarray bit lines being made electrically isolatable from and electrically communicable to said primary redundant global bit line by a corresponding one of said plurality of primary redundant access devices, each one of said plurality of primary redundant subarray bit lines communicating a primary redundant subarray bit line signal with a corresponding one of said plurality of primary redundant access devices and with each of a corresponding plurality of primary redundant subarray access devices each one of said plurality of primary redundant subarray access devices being capable of both electrically isolating and electrically communicating a primary redundant storage signal with a primary redundant means for storing and communicating said primary redundant storage signal;

d) a primary redundant means for sensing and amplifying said primary redundant global bit line signal, and for outputting an amplified primary redundant global bit line signal;

e) means for activating one of said plurality of primary redundant subarray bit lines corresponding to one of said plurality of primary subarray bit lines; and f) means for storing addresses of an activated one of said plurality of primary redundant subarray bit lines.

2. The integrated memory array circuit as defined in claim 1, wherein said means for activating activates said primary redundant global bit line and each one of said corresponding plurality of primary redundant subarray bit lines, and wherein said means for storing addresses stores addresses of said primary redundant global bit line and each one of said corresponding plurality of primary redundant subarray bit lines.

3. The integrated memory array circuit as defined in claim 1, further comprising:

a) a column comprising:
  (1) said primary global bit line;
  (2) said primary means for sensing and amplifying;
  (3) a secondary global bit line communicating a secondary global bit line signal with each of a corresponding plurality of secondary access devices, said secondary global bit line having a corresponding plurality of secondary subarray bit lines, each one of said plurality of secondary subarray bit lines being made electrically isolatable from and electrically communicable to said secondary global bit line by one of said plurality of secondary access devices, each one of said plurality of secondary subarray bit lines communicating a secondary subarray bit line signal with one of said plurality of secondary access devices, each of a plurality of secondary subarray access devices being capable of both electrically isolating and electrically communicating a secondary storage signal with a secondary means for storing and communicating said secondary storage signal;
  (4) a secondary means for sensing and amplifying said secondary global bit line signal and for outputting an amplified secondary global bit line signal;

b) a redundant column comprising:
  (1) said primary redundant global bit line;
  (2) said primary redundant means for sensing and amplifying;
  (3) a secondary redundant global bit line communicating a secondary redundant global bit line signal with each of a corresponding plurality of secondary redundant access devices, said secondary redundant global bit line having a corresponding plurality of secondary redundant subarray bit lines, each one of said plurality of secondary redundant subarray bit lines being made electrically isolatable from and electrically communicable to said secondary redundant global bit line by one of said plurality of secondary redundant access devices, each one of said plurality of secondary redundant subarray bit lines communicating a secondary redundant subarray bit line signal with one of said plurality of secondary redundant access devices, each of a plurality of secondary redundant subarray access devices being capable of both electrically isolating and electrically communicating a secondary redundant storage signal with a secondary redundant means for storing and communicating said secondary redundant storage signal; and
  (4) a secondary redundant means for sensing and amplifying said secondary redundant global bit line signal, and for outputting an amplified secondary redundant global bit line signal;

c) means for activating one of said plurality of secondary redundant subarray bit lines corresponding to one of said secondary subarray bit lines; and d) means for storing the memory address of an activated one of said plurality of secondary redundant subarray bit lines.

4. The integrated memory array circuit as defined in claim 3, further comprising a plurality of said columns and a plurality of said redundant columns.

5. The integrated memory array circuit as defined in claim 3, wherein each one of said plurality of primary subarray access devices is activated by a first primary word line signal from a primary word line to electrically isolate one of said primary means for storing and communicating said primary storage signal from a corresponding one of said plurality of primary subarray bit lines, and is activated by a second primary word line signal from said primary word line to electrically connect said one of said primary means for storing and communicating said primary storage signal with said corresponding one of said plurality of primary subarray bit lines, and wherein each one of said plurality of secondary subarray access devices is activated by a first secondary word line signal from a secondary word line to electrically isolate one of said secondary means for storing and communicating said secondary storage signal from a corresponding one of said plurality of secondary subarray bit lines, and is activated by a second secondary word line signal from said secondary word line to electrically connect said one of said secondary means for storing and communicating said secondary storage signal with said corresponding one of said plurality of secondary subarray bit lines.

6. The integrated memory array circuit as defined in claim 5, wherein each one of said plurality of primary redundant subarray access devices is activated by a corresponding one of said first primary word line signals from a corresponding one of said primary word lines to electrically isolate one of said primary redundant means for storing and communicating said primary redundant storage signal from a corresponding one of said plurality of primary redundant subarray bit lines, and is activated by a corresponding one of said second primary word line signals from said corresponding one of said primary word lines to electrically connect said one of said primary redundant means for storing and communicating said primary redundant storage signal with said corresponding one of said plurality of primary redundant subarray bit lines, and wherein each one of said plurality of secondary redundant subarray access devices is activated by a corresponding one of said first secondary word line signals from said corresponding one of said secondary word lines to electrically isolate one of said secondary redundant means for storing and communicating said secondary redundant storage signal from a corresponding one of said plurality of secondary redundant subarray bit lines, and is activated by one of said corresponding second secondary word line signals from said corresponding one of said secondary word lines to electrically connect said one of said secondary redundant means for storing and communicating said secondary redundant storage signal with said corresponding one of said plurality of secondary redundant subarray bit lines.

7. An integrated memory array circuit comprising:

a) a primary superglobal bit line communicating a primary superglobal bit line signal with each of a corresponding plurality of primary global access devices, said primary superglobal bit line having a corresponding plurality of primary global bit lines, each one of said plurality of primary global bit lines communicating a primary global bit line signal to a corresponding one of said plurality of primary global access devices and to each of a corresponding plurality of primary access devices, each one of said plurality of primary global bit lines having a corresponding plurality of primary subarray bit lines, each one of said plurality of primary subarray bit lines being made electrically isolatable from and electrically communicable to one of said plurality of primary global bit lines by one of said plurality of primary access devices, each one of said plurality of primary subarray bit lines communicating a primary subarray bit line signal with a corresponding one of said plurality of primary access devices and with each of a corresponding plurality of primary subarray access devices, each of said plurality of primary subarray access devices being capable of both electrically isolating and electrically communicating a primary storage signal with a primary means for storing and communicating said primary storage signal;

b) a primary means for sensing and amplifying said primary superglobal bit line signal, and for outputting an amplified primary superglobal bit line signal;

c) a primary redundant superglobal bit line communicating a primary redundant superglobal bit line signal with each of a corresponding plurality of primary redundant global access devices, said primary redundant superglobal bit line having a corresponding plurality of primary redundant global bit lines, each one of said plurality of primary redundant global bit lines communicating a primary redundant global bit line signal to a corresponding one of said plurality of primary redundant global access devices and to each of a corresponding plurality of primary redundant access devices, each one of said plurality of primary redundant global bit lines having a corresponding plurality of primary redundant subarray bit lines, each one of said plurality of primary redundant subarray bit lines being made electrically isolatable from and electrically communicable to one of said plurality of primary redundant global bit lines by one of said plurality of primary redundant access devices, each one of said plurality of primary redundant subarray bit lines communicating a primary redundant subarray bit line signal with a corresponding one of said plurality of primary redundant access devices and with each of a corresponding plurality of primary redundant subarray access devices, each of said plurality of primary redundant subarray access devices being capable of both electrically isolating and electrically communicating a primary redundant storage signal with a primary redundant means for storing and communicating said primary redundant storage signal;

d) a primary redundant means for sensing and amplifying said primary redundant superglobal bit line signal, and for outputting an amplified primary redundant superglobal bit line signal;

e) means for activating one of said plurality of primary redundant subarray bit lines corresponding to one of said plurality of primary subarray bit lines; and f) means for storing addresses of an activated one of said plurality of primary redundant subarray bit lines.

8. The integrated memory array circuit as defined in claim 7, wherein said means for activating activates said primary redundant superglobal bit line, each one of said corresponding plurality of primary global bit lines, and each one of said corresponding plurality of primary redundant subarray bit lines, and wherein said means for storing addresses stores addresses of each of said corresponding plurality of primary redundant global bit lines and each of said corresponding plurality of primary redundant subarray bit lines.

9. The integrated memory array circuit as defined in claim 7, further comprising:

a) a column comprising:
(1) said primary superglobal bit line;
(2) said primary means for sensing and amplifying;
(3) a secondary superglobal bit line communicating a secondary superglobal bit line signal with each of a corresponding plurality of secondary global access devices, said secondary superglobal bit line having a corresponding plurality of secondary global bit lines, each one of said plurality of secondary global bit lines communicating a secondary global bit line signal to a corresponding one of said plurality of secondary global access devices and to each of a corresponding plurality of secondary access devices, each one of said plurality of secondary global bit lines having a corresponding plurality of secondary subarray bit lines, each one of said plurality of secondary subarray bit lines being made electrically isolatable from and electrically communicable to said secondary global bit line by one of said plurality of secondary access devices, each one of said plurality of secondary subarray bit lines communicating a secondary subarray bit line signal with one of said plurality of secondary access devices, each of a plurality of secondary subarray access devices being capable of both electrically isolating and electrically communicating a secondary storage signal with a secondary means for storing and communicating said secondary storage signal; and
(4) a secondary means for sensing and amplifying said secondary superglobal bit line signal and for outputting an amplified secondary superglobal bit line signal;

b) a redundant column comprising:
(1) said primary redundant superglobal bit line;
(2) said primary redundant means for sensing and amplifying;
(3) a secondary redundant superglobal bit line communicating a secondary redundant superglobal bit line signal with each of a corresponding plurality of secondary redundant global access devices, said secondary redundant superglobal bit line having a corresponding plurality of secondary redundant global bit lines, each one of said plurality of secondary redundant global bit lines communicating a secondary redundant global bit line signal to a corresponding one of said plurality of secondary redundant global access devices and to each of a corresponding plurality of secondary redundant access devices, each one of said plurality of secondary redundant global bit lines having a corresponding plurality of secondary redundant subarray bit lines, each one of said plurality of secondary redundant subarray bit lines being made electrically isolatable from and electrically communicable to said secondary redundant global bit line by one of said plurality of secondary redundant access devices, each one of said plurality of secondary redundant subarray bit lines communicating a secondary redundant subarray bit line signal with one of said plurality of secondary redundant access devices, each of a plurality of secondary redundant subarray access devices being capable of both electrically isolating and electrically communicating a secondary redundant storage signal with a secondary redundant means for storing and communicating said secondary redundant storage signal;

(4) a secondary redundant means for sensing and amplifying said secondary redundant superglobal bit line signal, and for outputting an amplified secondary redundant superglobal bit line signal;

c) means for activating one of said plurality of secondary redundant subarray bit lines corresponding to one of said secondary subarray bit lines; and d) means for storing a memory address of an activated one of said plurality of secondary redundant subarray bit lines.

10. The integrated memory array circuit as defined in claim 9, further comprising a plurality of said columns and a plurality of said redundant column.

11. The integrated memory array circuit as defined in claim 9, wherein each one of said plurality of primary subarray access devices is activated by a first primary word line signal from a primary word line to electrically isolate one of said primary means for storing and communicating said primary storage signal from a corresponding one of said plurality of primary subarray bit lines, and is activated by a second primary word line signal from said primary word line to electrically connect said one of said primary means for storing and communicating said primary storage signal with said corresponding one of said plurality of primary subarray bit lines, and wherein each of said plurality of secondary subarray access devices is activated by a first secondary word line signal from a secondary word line to electrically isolate one of said secondary means for storing and communicating said secondary storage signal from a corresponding one of said plurality of secondary subarray bit lines, and is activated by a second secondary word line signal from said secondary word line to electrically connect said one of said secondary means for storing and communicating said secondary storage signal with said corresponding one of said plurality of secondary subarray bit lines.

12. The integrated memory array circuit as defined in claim 11, wherein each of said plurality of primary redundant subarray access devices is activated by a corresponding one of said first primary word line signals from a corresponding one of said primary word lines to electrically isolate one of said primary redundant means for storing and communicating said primary redundant storage signal from a corresponding one of said plurality of primary redundant subarray bit lines, and is activated by a corresponding one of said second primary word line signals from said corresponding one of said primary word lines to electrically connect said one of said primary redundant means for storing and communicating said primary redundant storage signal with said corresponding one of said plurality of primary redundant subarray bit lines, and wherein each of said plurality of secondary redundant subarray access devices is activated by a corresponding one of said first secondary word line signals from a corresponding one of said secondary word lines to electrically isolate one of said secondary redundant means for storing and communicating said secondary redundant storage signal from a corresponding one of said plurality of secondary redundant subarray bit lines, and is activated by one of said corresponding second secondary word line signals from said corresponding one of said secondary word lines to electrically connect said one of said secondary redundant means for storing and communicating said secondary redundant storage signal with said corresponding one of said plurality of secondary redundant subarray bit lines.

13. An integrated memory array circuit comprising:

a) a primary global bit line communicating a primary global bit line signal with each of a corresponding plurality of primary access devices, said primary global bit line having a corresponding plurality of primary subarray bit lines, each one of said plurality of primary subarray bit lines being made electrically isolatable from and electrically communicable to said primary global bit line by one of said plurality of primary access devices, each one of said plurality of primary subarray bit lines communicating a primary subarray bit line signal (1) one of said plurality of primary access devices;

(2) each of a corresponding plurality of primary subarray access devices, each one of said plurality of primary subarray access devices being capable of both electrically isolating and electrically communicating a primary storage signal with a primary means for storing and communicating said primary storage signal; and with (3) each of a corresponding plurality of primary replacement subarray access devices, each one of said plurality of primary replacement subarray access devices being capable of both electrically isolating and electrically communicating a primary replacement storage signal with a primary replacement means for storing and communicating said primary replacement storage signal;

b) a primary means for sensing and amplifying said primary global bit line signal, and for outputting an amplified primary global bit line signal;

c) means for activating one of said plurality of primary replacement subarray access devices corresponding to one of said plurality of primary subarray access devices; and d) means for storing a memory address of an activated one of a plurality of primary replacement subarray bit lines corresponding to said one of said plurality of primary subarray access devices.

14. The integrated memory array circuit as defined in claim 13, further comprising:

a) a primary redundant global bit line communicating a primary redundant global bit line signal with each of a corresponding plurality of primary redundant access devices, said primary redundant global bit line having a corresponding plurality of corresponding primary redundant subarray bit lines, each one of said plurality of primary redundant subarray bit lines being made electrically isolatable from and electrically communicable to said primary redundant global bit line by a corresponding one of said plurality of primary redundant access devices, each one of said plurality of primary redundant subarray bit lines communicating a primary redundant subarray bit line signal with:

(1) one of said plurality of primary redundant access devices; and with (2) each one of a corresponding plurality of primary redundant subarray access devices, each one of said plurality of primary redundant subarray access devices being capable of both electrically isolating and electrically communicating a primary redundant storage signal with a primary redundant means for storing and communicating said primary redundant storage signal;

b) a primary redundant means for sensing and amplifying said primary redundant global bit line signal, and for outputting an amplified primary redundant global bit line signal;

c) means for activating one of said plurality of primary redundant subarray bit lines corresponding to one of said plurality of primary subarray bit lines; and d) means for storing a memory address of an activated one of said plurality of primary redundant subarray bit lines corresponding to said one of said plurality of primary subarray bit lines.

15. The integrated memory array circuit as defined in claim 14, wherein each one of said plurality of primary redundant subarray bit lines communicates said primary redundant subarray bit line signal with:

a) each of a corresponding plurality of primary redundant replacement subarray access devices, each one of said plurality of primary redundant replacement subarray access devices being capable of both electrically isolating and electrically communicating a primary redundant replacement storage signal with a primary redundant replacement means for storing and communicating said primary redundant replacement storage signal;

wherein said integrated memory array circuit further comprises:

b) means for activating one of said plurality of primary redundant replacement subarray access devices corresponding to one of said plurality of primary redundant subarray access devices; and c) means for storing a memory address of an activated one of a plurality of primary redundant replacement subarray bit lines corresponding said one of said plurality of primary redundant subarray access devices.

16. The integrated memory array circuit as defined in claim 15, further comprising a column comprising:

a) said primary global bit line;

b) said primary means for sensing and amplifying;

c) a secondary global bit line communicating a secondary global bit line signal with each of a corresponding plurality of secondary access devices, said secondary global bit line having a corresponding plurality of secondary subarray bit lines, each one of said plurality of secondary subarray bit lines being made electrically isolatable from and electrically communicable to said secondary global bit line by a corresponding one of said plurality of secondary access devices, each one of said plurality of secondary subarray bit lines communicating a secondary subarray bit line signal with:

(1) a corresponding one of said plurality of secondary access devices;

(2) each of a corresponding plurality of secondary subarray access devices, each one of said plurality of secondary subarray access devices being capable of both electrically isolating and electrically communicating a secondary storage signal with a secondary means for storing and communicating said secondary storage signal, each one of said plurality of secondary subarray access devices communicating said secondary storage signal with said secondary means for storing and communicating said secondary storage signal; and with (3) each of a corresponding plurality of secondary replacement subarray access devices, each one of said plurality of secondary replacement subarray access devices being capable of both electrically isolating and electrically communicating a secondary replacement storage signal with a secondary replacement means for storing and communicating said secondary replacement storage signal, each one of said plurality of secondary replacement subarray access devices communicating said secondary replacement storage signal with said secondary replacement means for storing and communicating said secondary replacement storage signal;

(4) means for activating one of said plurality of secondary replacement subarray access devices corresponding to one of said plurality of secondary subarray access devices; and (5) means for storing a memory address of an activated one of a plurality of secondary replacement subarray bit lines corresponding to said one of said plurality of secondary subarray access devices;

d) a secondary means for sensing and amplifying said secondary global bit line signal, and for outputting an amplified secondary global bit line signal.

17. The integrated memory array circuit as defined in claim 16, further comprising:

a) a secondary redundant global bit line communicating a secondary redundant global bit line signal with each of a corresponding plurality of secondary redundant access devices, said secondary redundant global bit line having a corresponding plurality of secondary redundant subarray bit lines, each one of said plurality of secondary redundant subarray bit lines communicating a secondary redundant subarray bit line signal with:

(1) a corresponding one of said plurality of secondary redundant access devices; and with (2) each of a corresponding plurality of secondary redundant subarray access devices, each one of said plurality of secondary redundant subarray access devices communicating a secondary redundant storage signal with a secondary redundant means for storing and communicating said secondary redundant storage signal;

b) a secondary redundant means for sensing and amplifying said secondary redundant global bit line signal, and for outputting an amplified secondary redundant global bit line signal;

c) means for activating one of said plurality of secondary redundant subarray bit lines corresponding to one of said plurality of secondary subarray bit lines; and d) means for storing a memory address of an activated one of said plurality of secondary redundant subarray bit lines corresponding to said one of said plurality of secondary subarray bit lines.

18. The integrated memory array circuit as defined in claim 17, wherein each one of said plurality of secondary redundant subarray bit lines communicates said secondary redundant subarray bit line signal with:

a) each of a corresponding plurality of secondary redundant replacement subarray access devices, each one of said plurality of secondary redundant replacement subarray access devices communicating a secondary redundant replacement word line signal with a secondary redundant replacement word line, each one of said plurality of secondary redundant replacement subarray access devices communicating a secondary redundant replacement storage signal with a secondary redundant replacement means for storing and communicating said secondary redundant replacement storage signal;

wherein said integrated memory array circuit further comprises:
- a) means for activating one of said plurality of secondary redundant replacement subarray access devices corresponding to one of said plurality of secondary redundant subarray access devices; and
- b) means for storing a memory address of an activated one of said plurality of secondary redundant replacement subarray access devices corresponding to said one of said plurality of secondary redundant subarray access devices.

19. An integrated memory array circuit comprising:
- a) a primary superglobal bit line communicating a primary superglobal bit line signal with each of a corresponding plurality of primary global access devices, said primary superglobal bit line having a corresponding plurality of primary global bit lines, each one of said plurality of primary global bit lines communicating a primary global bit line signal to a corresponding one of said plurality of primary global access devices and to each of a corresponding plurality of primary access devices, each one of said plurality of primary global bit lines having a corresponding plurality of primary subarray bit lines, each one of said plurality of primary subarray bit lines communicating a primary subarray bit line signal with:
  - (1) a corresponding one of said plurality of primary access devices;
  - (2) each of a corresponding plurality of primary subarray access devices, each one of said plurality of primary subarray access devices being capable of both electrically isolating and electrically communicating a primary storage signal with a primary means for storing and communicating said primary storage signal, each said primary subarray access devices communicating a primary word line signal with a primary word line; and with
  - (3) each of a corresponding plurality of primary replacement subarray access devices, each one of said plurality of primary replacement subarray access devices being capable of both electrically isolating and electrically communicating a primary replacement storage signal with a primary replacement means for storing and communicating said primary replacement storage signal, each one of said plurality of primary replacement subarray access devices communicating a primary replacement word line signal with a primary replacement word line;
- b) means for activating one of said plurality of primary replacement subarray access devices corresponding to one of said plurality of primary subarray access devices;
- c) means for storing a memory address of all activated one of a plurality of primary replacement subarray bit lines corresponding to said one of said plurality of primary subarray access devices; and
- d) a primary means for sensing and amplifying said primary superglobal bit line signal, and for outputting an amplified primary superglobal bit line signal.

20. The integrated memory array circuit as defined in claim 19, further comprising:
- a) a primary redundant superglobal bit line communicating a primary redundant superglobal bit line signal with each of a corresponding plurality of primary redundant global access devices, said primary redundant superglobal bit line having a corresponding plurality of primary redundant global bit lines, each one of said plurality of primary redundant global bit lines communicating a primary redundant global bit line signal to one of said plurality of primary redundant global access devices and to each of a corresponding plurality of primary redundant access devices, each one of said plurality of primary redundant global bit lines having a corresponding plurality of primary redundant subarray bit lines, each one of said plurality of primary redundant subarray bit lines communicating a primary redundant subarray bit line signal with:
  - (1) a corresponding one of said plurality of primary redundant access devices; and with
  - (2) each of a corresponding plurality of primary redundant subarray access devices, each one of said plurality of primary redundant subarray access devices communicating a primary redundant word line signal with a primary word line, each of said plurality of primary redundant subarray access devices communicating a primary redundant storage signal with a primary redundant means for storing and communicating said primary redundant storage signal;
- b) a primary redundant means for sensing and amplifying said primary redundant superglobal bit line signal, and for outputting an amplified primary redundant superglobal bit line signal;
- c) means for activating one of said plurality of primary redundant subarray bit lines corresponding to one of said plurality of primary subarray bit lines; and
- d) means for storing a memory address of an activated one of said plurality of primary redundant subarray bit lines corresponding to said one of said plurality of primary subarray bit lines.

21. The integrated memory array circuit as defined in claim 20, wherein each one of said plurality of primary redundant subarray bit lines communicates said primary redundant subarray bit line signal with:
- a) each of a corresponding plurality of primary redundant replacement subarray access devices, each one of said plurality of primary redundant replacement subarray access devices communicating a primary redundant replacement word line signal with a primary redundant replacement word line, each one of said plurality of primary redundant replacement subarray access devices communicating a primary redundant replacement storage signal with a primary redundant replacement means for storing and communicating said primary redundant replacement storage signal;

wherein said integrated memory array circuit further comprises:
- (1) means for activating one of said plurality of primary redundant replacement subarray access devices corresponding to one of said plurality of primary redundant subarray access devices; and
- (2) means for storing a memory address of an activated one of said plurality of primary redundant replacement subarray access devices corresponding to said one of said plurality of primary redundant subarray access devices.

22. The integrated memory array circuit as defined in claim 19, further comprising a column comprising:
- a) said primary superglobal bit line;
- b) said primary means for sensing and amplifying;
- c) a secondary superglobal bit line communicating a secondary superglobal bit line signal with each of a corresponding plurality of secondary global access devices, said secondary superglobal bit line having a corresponding plurality of secondary global bit lines, each one of said plurality of secondary global bit lines communicating a secondary global bit line signal with a corresponding one of said plurality of secondary global access devices and to each of a corresponding plurality of secondary access devices and having a corresponding plurality of secondary subarray bit lines, each one of said plurality of secondary subarray bit lines communicating a secondary subarray bit line signal with:

(1) a corresponding one of said plurality of secondary access devices;

(2) each of a corresponding plurality of secondary subarray access devices, each one of said plurality of secondary subarray access devices being capable of both electrically isolating and electrically communicating a secondary storage signal with a secondary means for storing and communicating said secondary storage signal, each one of said plurality of secondary subarray access devices communicating a secondary word line signal with a secondary word line; and with (3) each of a corresponding plurality of secondary replacement subarray access devices, each one of said plurality of secondary replacement subarray access devices being capable of both electrically isolating and electrically communicating a secondary replacement storage signal with a secondary replacement means for storing and communicating said secondary replacement storage signal, each one of said plurality of secondary replacement subarray access devices communicating a secondary replacement word line signal with a secondary replacement word line;

d) means for activating one of said plurality of secondary replacement subarray access devices corresponding to one of said plurality of secondary subarray access devices;

e) means for storing a memory address of an activated one of a plurality of secondary replacement subarray bit lines corresponding to said one of said plurality of secondary subarray access devices; and f) a secondary means for sensing and amplifying said secondary superglobal bit line signal, and for outputting an amplified secondary superglobal bit line signal.

23. The integrated memory array circuit as defined in claim 22, further comprising:

a) a secondary redundant superglobal bit line communicating a secondary redundant superglobal bit line signal with each of a corresponding plurality of secondary redundant global access devices, said secondary redundant superglobal bit line having a corresponding plurality of secondary redundant global bit lines, each one of said plurality of secondary redundant global bit lines communicating a secondary redundant global bit line signal with a corresponding one of said plurality of secondary redundant global access devices and to each of a corresponding plurality of secondary redundant access devices and having a corresponding plurality of secondary redundant subarray bit lines, each one of said plurality of secondary redundant subarray bit lines communicating a secondary redundant subarray bit line signal with:

(1) a corresponding one of said plurality of secondary redundant access devices; and with (2) each of a corresponding plurality of secondary redundant subarray access devices, each one of said plurality of secondary redundant subarray access devices communicating a corresponding one of said secondary word line signals with a corresponding one of said secondary word lines, each one of said plurality of secondary redundant subarray access devices communicating a secondary redundant storage signal with a secondary redundant means for storing and communicating said secondary redundant storage signal;

b) a secondary redundant means for sensing and amplifying said secondary redundant superglobal bit line signal, and for outputting an amplified secondary redundant superglobal bit line signal;

c) means for activating one of said plurality of secondary redundant subarray bit lines corresponding to one of said plurality of secondary subarray bit lines; and d) means for storing a memory address of an activated one of said plurality of secondary redundant subarray bit lines corresponding to said one of said plurality of secondary subarray bit lines.

24. The integrated memory array circuit as defined in claim 23, wherein each one of said plurality of secondary redundant subarray bit lines communicates said secondary redundant subarray bit line signal with:

a) each of a corresponding plurality of secondary redundant replacement subarray access devices, each one of said plurality of secondary redundant replacement subarray access devices communicating a secondary redundant replacement word line signal with a secondary redundant replacement word line, each one of said plurality of secondary redundant replacement subarray access devices communicating a secondary redundant replacement storage signal with a secondary redundant replacement means for storing and communicating said secondary redundant replacement storage signal;

wherein said integrated memory array circuit further comprises:

a) means for activating one of said plurality of secondary redundant replacement subarray access devices corresponding to one of said plurality of secondary redundant subarray access devices; and b) means for storing a memory address of an activated one of said plurality of secondary redundant replacement subarray access devices corresponding to one of said plurality of secondary redundant subarray access devices.

25. An integrated memory array circuit comprising:

a) a primary global bit line communicating a primary global bit line signal with a first electrode of each one of a corresponding plurality of primary FET devices, said primary global bit line having a corresponding plurality of primary subarray bit lines, each one of said plurality of primary subarray bit lines communicating a primary subarray bit line signal with a second electrode of one of said corresponding plurality of primary FET devices and with a first electrode of each one of a corresponding plurality of primary subarray FET devices, each one of said plurality of primary subarray FET devices having a gate communicating a primary word line signal with a corresponding primary word line, each one of said plurality of primary subarray FET devices having a second electrode communicating a primary storage signal with a primary means for storing and communicating said primary storage signal;

b) a primary means for sensing and amplifying said primary global bit line signal, and for outputting an amplified primary global bit line signal;

c) a primary redundant global bit line communicating a primary redundant global bit line signal with a first electrode of each one of a corresponding plurality of primary redundant FET devices, said primary redundant global bit line having a corresponding plurality of primary redundant subarray bit lines, each one of said plurality of primary redundant subarray bit lines communicating a primary redundant subarray bit line signal with a second electrode of one of said plurality of primary redundant FET devices and with a first electrode of each one of a corresponding plurality of primary redundant subarray FET devices, each one of said plurality of primary redundant subarray FET devices having a gate communicating one of said primary word line signals with one of said primary word lines, each one of said plurality of primary redundant subarray FET devices having a second electrode communicating a primary redundant storage signal with a primary redundant means for storing and communicating said primary redundant storage signal;

d) a primary redundant means for sensing and amplifying said primary redundant global bit line signal, and for outputting an amplified primary redundant global bit line signal;

e) means for activating one of said plurality of primary redundant subarray bit lines corresponding to one of said plurality of primary subarray bit lines; and f) means for storing a memory address of an activated one of said plurality of primary redundant subarray bit lines corresponding to said one of said plurality of primary subarray bit lines.

26. The integrated memory array circuit as defined in claim 21, wherein said means for activating activates said primary redundant global bit line and each of said corresponding plurality of primary redundant subarray bit lines, and wherein said means for storing the memory address stores the memory address of said primary redundant global bit line and each of said corresponding plurality of primary redundant subarray bit lines.

27. The integrated memory array circuit as defined in claim 25, further comprising:

a) a column comprising:
   (1) said primary global bit line;
   (2) said primary means for sensing and amplifying;
   (3) a secondary global bit line communicating a secondary global bit line signal with a first electrode of each of a corresponding plurality of secondary FET devices and having a corresponding plurality of secondary subarray bit lines each communicating a secondary subarray bit line signal with a second electrode of one of said plurality of secondary FET devices and with a first electrode of each of a corresponding plurality of secondary subarray FET devices, each of said secondary subarray FET devices having a gate communicating a secondary word line signal with a secondary word line, each of said secondary subarray FET devices having a second electrode communicating a secondary storage signal with a secondary means for storing and communicating said secondary storage signal; and
   (4) secondary means for sensing and amplifying said secondary global bit line signal and for outputting an amplified secondary global bit line signal;

b) a redundant column comprising:
   (1) said primary redundant global bit line;
   (2) said primary redundant means for sensing and amplifying;
   (3) a secondary redundant global bit line communicating a secondary redundant global bit line signal with a first electrode of each of a corresponding plurality of secondary redundant FET devices and having a corresponding plurality of secondary redundant subarray bit lines each communicating a secondary redundant subarray bit line signal with a second electrode of one of said plurality of secondary redundant FET devices and with a first electrode of each of a corresponding plurality of secondary redundant subarray FET devices, each one of said plurality of secondary redundant subarray FET devices having a gate communicating a corresponding one of said secondary word line signals with a corresponding one of said secondary word lines, each one of said plurality of secondary redundant subarray FET devices having a second electrode communicating a secondary redundant storage signal with a secondary redundant means for storing and communicating said secondary redundant storage signal; and
   (4) a secondary redundant means for sensing and amplifying said secondary redundant global bit line signal, and for outputting an amplified secondary redundant global bit line signal;

c) means for activating one of said plurality of secondary redundant subarray bit lines corresponding to one of said plurality of secondary subarray bit lines; and d) means for storing a memory address of an activated one of said plurality of secondary redundant subarray bit lines.

28. The integrated memory array circuit as defined in claim 27, further comprising a plurality of said columns and a plurality of said redundant columns.

29. The integrated memory array circuit as defined in claim 27, wherein each one of said plurality of primary subarray FET devices is activated by a first state of said primary word line signal from said primary word line to electrically isolate one of said primary means for storing and communicating said primary storage signal from a corresponding one of said plurality of primary subarray bit lines, and is activated by a second state of said primary word line signal from said primary word line to electrically connect said one of said primary means for storing and communicating said primary storage signal with said corresponding one of said plurality of primary subarray bit lines, and wherein each of said secondary subarray FET devices is activated by a first state of said secondary word line signal from said secondary word line to electrically isolate one of said secondary means for storing and communicating said secondary storage signal from a corresponding one of said plurality of secondary subarray bit lines, and is activated by a second state of said secondary word line signal from a said secondary word line to electrically connect said one of said secondary means for storing and communicating said secondary storage signal with said corresponding one of said plurality of secondary subarray bit lines.

30. The integrated memory array circuit as defined in claim 29, wherein each of said primary redundant subarray FET devices is activated by a corresponding one of said first states of said primary word line signals from a corresponding one of said primary word lines to electrically isolate one of said primary redundant means for storing and communicating said primary redundant storage signal from a corresponding one of said plurality of primary redundant subarray bit lines, and is activated by a corresponding of said second states of said primary word line signals from a corresponding one of said primary word lines to electrically connect said one of said primary redundant means for storing and communicating said primary redundant storage signal with said corresponding one of said plurality of primary redundant subarray bit lines, and wherein each of said secondary redundant subarray FET devices is activated by a corresponding one of said first states of said secondary word line signals from a corresponding one of said plurality of primary redundant subarray bit lines secondary word lines to electrically isolate one of said secondary redundant means for storing and communicating said secondary storage signal from a corresponding one of said plurality of secondary redundant subarray bit lines, and is activated by a corresponding one of said second states of said secondary word line signals from a corresponding one of said secondary word line signals from a corresponding one of said secondary word lines to electrically connect said one of said secondary redundant means for storing and communicating said secondary redundant storage signal with said corresponding one of said plurality of secondary redundant subarray bit lines.

31. An integrated memory array circuit comprising:

a) a primary superglobal bit line communicating a primary superglobal bit line signal with a first electrode of each one of a corresponding plurality of primary global FET devices, said primary superglobal bit line having a corresponding plurality of primary global bit lines, each one of said plurality of primary global bit lines communicating a primary global bit line signal to a second electrode of one of said plurality of primary global FET devices and to a first electrode of each of a corresponding plurality of primary FET devices, each one of said plurality of primary global bit lines having a corresponding plurality of primary subarray bit lines, each one of said plurality of primary subarray bit lines communicating a primary subarray bit line signal with a second electrode of one of said plurality of primary FET devices and with a first electrode of each one of a corresponding plurality of primary subarray FET devices, each of said primary plurality of subarray FET devices having a gate communicating a primary word line signal with a primary word line, each one of said primary subarray FET devices having a second electrode communicating a primary storage signal with a primary means for storing and communicating said primary storage signal;

b) primary means for sensing and amplifying said primary superglobal bit line signal and for outputting an amplified primary superglobal bit line signal;

c) a primary redundant superglobal bit line communicating a primary redundant superglobal bit line signal with a first electrode of each of a corresponding plurality of primary redundant global FET devices, said primary redundant superglobal bit line having a corresponding plurality of primary redundant global bit lines, each one of said plurality of primary redundant global bit lines communicating a primary redundant global bit line signal to a second electrode of one of said plurality of primary redundant global FET devices and to a first electrode of each one of a corresponding plurality of primary redundant FET devices, said plurality of primary redundant global bit lines having a corresponding plurality of primary redundant subarray bit lines, each one of said plurality of primary redundant subarray bit lines communicating a primary redundant subarray bit line signal with a second electrode of one of said plurality of primary redundant FET devices and with a first electrode of each of a corresponding plurality of primary redundant subarray FET devices, each one of said plurality of primary redundant subarray FET devices having a gate communicating a corresponding one of said primary word line signals with a corresponding one of said primary word lines, each one of said plurality of primary redundant subarray FET devices having a second electrode communicating a primary redundant storage signal with a primary redundant means for storing and communicating said primary redundant storage signal;

d) primary redundant means for sensing and amplifying said primary redundant superglobal bit line signal and for outputting an amplified primary redundant superglobal bit line signal;

e) means for activating one of said plurality of primary redundant subarray bit lines corresponding to one of said plurality of primary subarray bit lines; and f) means for storing a memory address of an activated one of said plurality of primary redundant subarray bit lines corresponding to said one of said plurality of primary subarray bit lines.

32. The integrated memory array circuit as defined in claim 31, further comprising:

a) a column comprising:
(1) said primary superglobal bit line;
(2) said primary means for sensing and amplifying;
(3) a secondary superglobal bit line communicating a secondary superglobal bit line signal with a first electrode of each of a corresponding plurality of secondary global FET devices, said secondary superglobal bit line having a corresponding plurality of secondary global bit lines, each one of said plurality of secondary global bit lines communicating a secondary global bit line signal with a second electrode of one of said plurality of secondary global FET devices and to a first electrode of each of a corresponding plurality of a secondary FET devices and having a corresponding plurality of secondary subarray bit lines each communicating a secondary subarray bit line signal with a second electrode of one of said plurality of secondary FET devices and with a first electrode of each of a corresponding plurality of secondary subarray FET devices, each one of said plurality of secondary subarray FET devices having a gate communicating a secondary word line signal with a secondary word line, each one of said plurality of secondary subarray FET devices having a second electrode communicating a secondary storage signal with a secondary means for storing and communicating said secondary storage signal; and
(4) a secondary means for sensing and amplifying said secondary superglobal bit line signal and for outputting an amplified secondary superglobal bit line signal;

b) a redundant column comprising:
(1) said primary redundant superglobal bit line;
(2) said primary redundant means for sensing and amplifying;
(3) a secondary redundant superglobal bit line communicating a secondary redundant superglobal bit line signal with a first electrode of each of a corresponding plurality of secondary redundant global FET devices, said secondary redundant superglobal bit line having a corresponding plurality of secondary redundant global bit lines, each one of said plurality of secondary redundant global bit lines communicating a secondary redundant global bit line signal with a second electrode of one of said secondary redundant global FET devices and to a first electrode of each of a corresponding plurality of secondary redundant FET devices and having a corresponding plurality of secondary redundant subarray bit lines each communicating a secondary redundant subarray bit line signal with a second electrode of one of said plurality of secondary redundant FET devices and with a first electrode of each of a corresponding plurality of secondary redundant subarray FET devices, each one of said plurality of secondary redundant subarray FET devices having a gate communicating a corresponding one of said secondary word line signals with a corresponding one of said secondary word lines, each one of said plurality of secondary redundant subarray FET devices having a second electrode communicating a secondary redundant storage signal with a secondary redundant means for storing and communicating said secondary redundant storage signal; and (4) a secondary redundant means for sensing and amplifying said secondary redundant superglobal bit line signal and for outputting an amplified secondary redundant superglobal bit line signal;

c) means for activating one of said plurality of secondary redundant subarray bit lines corresponding to one of said plurality of secondary subarray bit lines; and d) means for storing a memory address of an activated one of said plurality of secondary redundant subarray bit lines corresponding to said one of said plurality of secondary subarray bit lines.

33. The integrated memory array circuit as defined in claim 32, further comprising a plurality of said columns and a plurality of said redundant columns.

34. An integrated memory array circuit comprising:
a) a primary global bit line communicating a primary global bit line signal with a first electrode of each of a corresponding plurality of primary FET devices, said primary global bit line having a corresponding plurality of primary subarray bit lines, each one of said plurality of primary subarray bit lines communicating a primary subarray bit line signal with:

(1) a second electrode of one of said plurality of primary FET devices;

(2) a first electrode of each of a corresponding plurality of primary subarray FET devices, each one of said plurality of primary subarray FET devices being capable of both electrically isolating and electrically communicating a primary storage signal with a primary means for storing and communicating said primary storage signal, each one of said plurality of primary subarray FET devices having a gate communicating a primary word line signal with a primary word line, each one of said plurality of primary subarray FET devices having a second electrode communicating said primary storage signal with said primary means for storing and communicating said primary storage signal; and with (3) a first electrode of each of a corresponding plurality of primary replacement subarray FET devices, each one of said plurality of primary replacement subarray FET devices being capable of both electrically isolating and electrically communicating a primary replacement storage signal with a primary replacement means for storing and communicating said primary replacement storage signal, each one of said plurality of primary replacement subarray FET devices having a gate communicating a primary replacement word line signal with a primary replacement word line, each of said plurality of primary replacement subarray FET devices having a second electrode communicating said primary replacement storage signal with said primary replacement means for storing and communicating said primary replacement storage signal;

b) means for activating one of said plurality of primary replacement subarray FET devices corresponding to one of said plurality of primary subarray FET devices; and c) means for storing a memory address of an activated one of a plurality of primary replacement subarray bit lines corresponding to said one of said plurality of primary subarray FET devices.

d) a primary means for sensing and amplifying said primary global bit line signal; and for outputting an amplified primary global bit line signal.

35. The integrated memory array circuit as defined in claim 34, further comprising:
a) a primary redundant global bit line communicating a primary redundant global bit line signal with a first electrode of each of a corresponding plurality of corresponding primary redundant FET devices, said primary redundant global bit line having a corresponding plurality of primary redundant subarray bit lines, each one of said plurality of primary redundant subarray bit lines communicating a primary redundant subarray bit line signal with:

(1) a second electrode of one of said plurality of primary redundant FET devices; and with (2) a first electrode of each of a corresponding plurality of primary redundant subarray FET devices, each one of said plurality of primary redundant subarray FET devices having a gate communicating a corresponding one of said primary word line signals with a corresponding one of said primary word lines, each one of said plurality of primary redundant subarray FET devices having a second electrode communicating a primary redundant storage signal with a primary redundant means for storing and communicating said primary redundant storage signal;

b) a primary redundant means for sensing and amplifying said primary redundant global bit line signal, and for outputting an amplified primary redundant global bit line signal;

c) means for activating one of said plurality of primary redundant subarray bit lines corresponding to one of said plurality of primary subarray bit lines; and d) means for storing a memory address of an activated one of said plurality of primary redundant subarray bit lines corresponding to said one of said plurality of primary subarray bit lines.

36. The integrated memory array circuit as defined in claim 35, wherein each one of said plurality of primary redundant subarray bit lines communicates said primary redundant subarray bit line signal with:

a) a first electrode of each of a corresponding plurality of primary redundant replacement subarray FET devices, each one of said plurality of primary redundant replacement subarray FET devices having a gate communicating a primary redundant replacement word line signal with a primary redundant replacement word line, each one of said plurality of primary redundant replacement subarray FET devices having a second electrode communicating a primary redundant replacement storage signal with a primary redundant replacement means for storing and communicating said primary redundant replacement storage signal, wherein said integrated memory array circuit further comprises:

a) means for activating one of said plurality of primary redundant replacement subarray FET devices corresponding to one of said plurality of primary redundant subarray FET devices; and b) means for storing a memory address of an activated one of said plurality of primary redundant replacement subarray FET devices corresponding said one of said plurality of primary redundant subarray FET devices.

37. The integrated memory array circuit as defined in claim 34, further comprising a column comprising:

a) said primary global bit line;

b) said primary means for sensing and amplifying;

c) a secondary global bit line communicating a secondary global bit line signal with a first electrode of each of a corresponding plurality of secondary FET devices, said secondary global bit line having a corresponding plurality of secondary subarray bit lines, each one of said plurality of secondary subarray bit lines communicating a secondary subarray bit line signal with:

(1) a second electrode of one of said plurality of secondary FET devices;

(2) a first electrode of each of a corresponding plurality of secondary subarray FET devices, each one of said plurality of secondary subarray FET devices being capable of both electrically isolating and electrically communicating a secondary storage signal with a secondary means for storing and communicating said secondary storage signal, each one of said plurality of secondary subarray FET devices having a gate communicating a secondary word line signal with a secondary word line, each one of said plurality of secondary subarray FET devices having a second electrode communicating said secondary storage signal with said secondary means for storing and communicating said secondary storage signal; and with (3) a first electrode of each of a corresponding plurality of secondary replacement subarray FET devices, each one of said plurality of secondary replacement subarray FET devices being capable of both electrically isolating and electrically communicating a secondary replacement storage signal with a secondary replacement means for storing and communicating said secondary replacement storage signal, each one of said plurality of secondary replacement subarray FET devices having a gate communicating a secondary replacement word line signal with a secondary replacement word line, each one of said plurality of secondary replacement subarray FET devices having a second electrode communicating said secondary replacement storage signal with said secondary replacement means for storing and communicating said secondary replacement storage signal;

d) means for activating one of said plurality of secondary replacement subarray FET devices corresponding to one of said plurality of secondary subarray FET devices;

e) means for storing a memory address of an activated one of a plurality of secondary replacement subarray bit lines corresponding to said one of said plurality of secondary subarray FET devices; and f) a secondary means for sensing and amplifying said secondary global bit line signal, and for outputting an amplified secondary global bit line signal.

38. The integrated memory array circuit as defined in claim 37, further comprising:

a) a secondary redundant global bit line communicating a secondary redundant global bit line signal with a first electrode of each of a corresponding plurality of corresponding secondary redundant FET devices, said secondary redundant global bit line having a corresponding plurality of secondary redundant subarray bit lines, each one of said plurality of secondary redundant subarray bit lines communicating a secondary redundant subarray bit line signal with:

(1) a second electrode of one of said plurality of secondary redundant FET devices; and with (2) a first electrode of each of a corresponding plurality of secondary redundant subarray FET devices, each one of said plurality of secondary redundant subarray FET devices having a gate communicating a corresponding one of said secondary word line signals with a corresponding one of said secondary word lines, each one of said plurality of secondary redundant subarray FET devices having a second electrode communicating a secondary redundant storage signal with a secondary redundant means for storing and communicating said secondary redundant storage signal;

b) a secondary redundant means for sensing and amplifying said secondary redundant global bit line signal, and for outputting an amplified secondary redundant global bit line signal;

c) means for activating one of said plurality of secondary redundant subarray bit lines corresponding to one of said plurality of secondary subarray bit lines; and d) means for storing a memory address of an activated one of said plurality of secondary redundant subarray bit lines corresponding to said one of said plurality of secondary subarray bit lines.

39. The integrated memory array circuit as defined in claim 38, wherein each one of said plurality of secondary redundant subarray bit lines communicates said secondary redundant subarray bit line signal with:

a) a first electrode of each of a corresponding plurality of secondary redundant replacement subarray FET devices, each one of said plurality of secondary redundant replacement subarray FET devices having a gate communicating a secondary redundant replacement word line signal with a secondary redundant replacement word line, each one of said plurality of secondary redundant replacement subarray FET devices having a second electrode communicating a secondary redundant replacement storage signal with a secondary replacement means for storing and communicating said secondary redundant replacement storage signal;

wherein said integrated memory array circuit further comprises:

a) means for activating one of said plurality of secondary redundant replacement subarray FET devices corresponding to one of said plurality of secondary redundant subarray FET devices; and b) means for storing a memory address of an activated one of said plurality of secondary redundant replacement subarray FET devices corresponding said one of said plurality of secondary redundant subarray FET devices.

40. An integrated memory array circuit comprising:

a) a primary superglobal bit line communicating a primary superglobal bit line signal with a first electrode of each one of a corresponding plurality of primary global FET devices, said primary superglobal bit line having a corresponding plurality of primary global bit lines, each one of said plurality of primary global bit lines communicating a primary global bit line signal to a second electrode of one of said plurality of primary global FET devices and to a first electrode of each of a corresponding plurality of primary FET devices, each one of said plurality primary global bit lines having a corresponding plurality of primary subarray bit lines, each one of said plurality of primary subarray bit lines communicating a primary subarray bit line signal with:

(1) a second electrode of one of said plurality of primary FET devices;

(2) a first electrode of each of a corresponding plurality of primary subarray FET devices, each one of said plurality of primary subarray FET devices being capable of both electrically isolating and electrically communicating a primary storage signal with a primary means for storing and communicating said primary storage signal, each one of said plurality of primary subarray FET devices having a gate communicating a primary word line signal with a primary word line, each one of said plurality of primary subarray FET devices having said second electrode communicating a primary storage signal with said primary means for storing and communicating said primary storage signal; and with (3) a first electrode of each of a corresponding plurality of primary replacement subarray FET devices, each of said plurality of primary replacement subarray FET devices being capable of both electrically isolating and electrically communicating a primary replacement storage signal with a primary replacement means for storing and communicating said primary replacement storage signal, each one of said plurality of primary replacement subarray FET devices having a gate communicating a primary replacement word line signal with a primary replacement word line, each one of said plurality of primary replacement subarray FET devices having a second electrode communicating said primary replacement storage signal with said primary replacement means for storing and communicating said primary replacement storage signal;

(b) means for activating one of said plurality of primary replacement subarray FET devices corresponding to one of said plurality of primary subarray FET devices; and (c) means for storing a memory address of an activated one of a plurality of primary replacement subarray bit lines corresponding to said one of said plurality of primary subarray FET devices.

(d) a primary means for sensing and amplifying said primary superglobal bit line signal, and for outputting an amplified primary superglobal bit line signal.

41. The integrated memory array circuit as defined in claim 40, farther comprising:

a) a primary redundant superglobal bit line communicating a primary redundant superglobal bit line signal with a first electrode of each of a corresponding plurality of primary redundant global FET devices, said primary redundant superglobal bit line having a corresponding plurality of primary redundant global bit lines, each one of said plurality of primary redundant global bit lines communicating a primary redundant global bit line signal to a second electrode of one of said plurality of primary redundant global FET devices and to a first electrode of each of a corresponding plurality of primary redundant FET devices, each of said plurality of primary redundant global bit lines having a corresponding plurality of primary redundant subarray bit lines, each one of said plurality of primary redundant subarray bit lines communicating a primary redundant subarray bit line signal with:

(1) a second electrode of one of said plurality of primary redundant FET devices; and with:

(2) a first electrode of each of a corresponding plurality of primary redundant subarray FET devices, each one of said plurality of primary redundant subarray FET devices having a gate communicating a corresponding one of said primary word line signals with a corresponding one of said primary word lines, each one of said plurality of primary redundant subarray FET devices having a second electrode communicating a primary redundant storage signal with a primary redundant means for storing and communicating said primary redundant storage signal;

b) a primary redundant means for sensing and amplifying said primary redundant superglobal bit line signal, and for outputting an amplified primary redundant superglobal bit line signal;

c) means for activating one of said plurality of primary redundant subarray bit lines corresponding to one of said plurality of primary subarray bit lines; and d) means for storing a memory address of an activated one of said plurality of primary redundant subarray bit lines corresponding to said one of said primary plurality of subarray bit line.

42. The integrated memory array circuit as defined in claim 41, wherein each one of said plurality of primary redundant subarray bit lines communicates said primary redundant subarray bit line signal with:

a) a first electrode of each of a corresponding plurality of primary redundant replacement subarray FET devices, each one of said plurality of primary redundant replacement subarray FET devices having a gate communicating a primary redundant replacement word line signal with a primary redundant replacement word line, each one of said plurality of primary redundant replacement subarray FET devices having a second electrode communicating a primary redundant replacement storage signal with a primary redundant replacement means for storing and communicating said primary redundant replacement storage signal;

wherein said integrated memory array circuit further comprises:

a) means for activating one of said plurality of primary redundant replacement subarray FET devices corresponding to one of said plurality of primary redundant subarray FET devices; and b) means for storing a memory address of an activated one of said plurality of primary redundant replacement subarray FET devices corresponding said one of said plurality of primary redundant subarray FET devices.

43. The integrated memory array circuit as defined in claim 40, further comprising a column comprising:

a) said primary superglobal bit line;

b) said primary means for sensing and amplifying;

c) a secondary superglobal bit line communicating a secondary superglobal bit line signal with a first electrode of each of a corresponding plurality of secondary global FET devices, said secondary superglobal bit line having a corresponding plurality of secondary global bit lines, each one of said plurality of secondary global bit lines communicating a secondary global bit line signal with a second electrode of one of said plurality of secondary global FET devices and to a first electrode of each of a corresponding plurality of secondary FET devices and having a corresponding plurality of secondary subarray bit lines, each one of said plurality of secondary subarray bit lines communicating a secondary subarray bit line signal with:
  (1) a second electrode of one of said plurality of secondary FET devices;
  (2) a first electrode of each of a corresponding plurality of secondary subarray FET devices, each one of said plurality of secondary subarray FET devices being capable of both electrically isolating and electrically communicating a secondary storage signal with a secondary means for storing and communicating said secondary storage signal, each one of said plurality of secondary subarray FET devices having a gate communicating a secondary word line signal with a secondary word line, each one of said plurality of secondary subarray FET devices having a second electrode communicating said secondary storage signal with said secondary means for storing and communicating said secondary storage signal; and with
  (3) a first electrode of each of a corresponding plurality of secondary replacement subarray FET devices, each one of said plurality of secondary replacement subarray FET devices being capable of both electrically isolating and electrically communicating a secondary replacement storage signal with a secondary replacement means for storing and communicating said secondary replacement storage signal, each one of said plurality of secondary replacement subarray FET devices having a gate communicating a secondary replacement word line signal with a secondary replacement word line, each one of said plurality of secondary replacement subarray FET devices having a second electrode communicating said secondary replacement storage signal with said secondary replacement means for storing and communicating said secondary replacement storage signal;
d) means for activating one of said plurality of secondary replacement subarray FET devices corresponding to one of said plurality of secondary subarray FET devices;
e) means for storing a memory address of an activated one of a plurality of secondary replacement subarray bit lines corresponding to said one of said plurality of secondary FET devices; and
f) a secondary means for sensing and amplifying said secondary superglobal bit line signal, and for outputting an amplified secondary superglobal bit line signal.

44. The integrated memory array circuit as defined in claim 43, further comprising:
a) a secondary redundant superglobal bit line communicating a secondary redundant superglobal bit line signal with a first electrode of each of a corresponding plurality of secondary redundant global FET devices, said secondary redundant superglobal bit line having a corresponding plurality of secondary redundant global bit lines, each one of said plurality of secondary redundant global bit lines communicating a secondary redundant global bit line signal with a second electrode of one of said plurality of secondary redundant global FET devices and to a first electrode of each of a corresponding plurality of secondary redundant FET devices and having a corresponding plurality of secondary redundant subarray bit lines, each one of said plurality of secondary redundant subarray bit lines communicating a secondary redundant subarray bit line signal with:
  (1) a second electrode of one of said plurality of secondary redundant FET devices; and with
  (2) a first electrode of each of a corresponding plurality of secondary redundant subarray FET devices, each one of said plurality of secondary redundant subarray FET devices having a gate communicating a corresponding one of said secondary word line signals with a corresponding one of said secondary word lines, each one of said plurality of secondary redundant subarray FET devices having a second electrode communicating a secondary redundant storage signal with a secondary redundant means for storing and communicating said secondary redundant storage signal;
b) a secondary redundant means for sensing and amplifying said secondary redundant superglobal bit line signal, and for outputting an amplified secondary redundant superglobal bit line signal;
c) means for activating one of said plurality of secondary redundant subarray bit lines corresponding to one of said plurality of secondary subarray bit lines; and
d) means for storing a memory address of an activated one of said plurality of secondary redundant subarray bit lines corresponding to said one of said plurality of secondary subarray bit lines.

45. The integrated memory array circuit as defined in claim 44, wherein each one of said plurality of secondary redundant subarray bit lines communicates said secondary redundant subarray bit line signal with:
a) a first electrode of each of a corresponding plurality of secondary redundant replacement subarray FET devices, each one of said plurality of secondary redundant replacement subarray FET devices having a gate communicating a secondary redundant replacement word line signal with a secondary redundant replacement word line, each one of said plurality of secondary redundant replacement subarray FET devices having a second electrode communicating a secondary redundant replacement storage signal with a secondary redundant replacement means for storing and communicating said secondary redundant replacement storage signal;

wherein said integrated memory array circuit further comprises:
a) means for activating one of said plurality of secondary redundant replacement subarray FET devices corresponding to one of said plurality of secondary redundant subarray FET devices; and
b) means for storing a memory address of an activated one of said plurality of secondary redundant replacement subarray FET devices corresponding said one of said plurality of secondary redundant subarray FET devices.

46. An integrated memory device comprising:
a primary global bit line;
a plurality of subarray bit lines;
a plurality of access devices connected to the plurality of subarray bit lines and the primary global bit line;

a first sense amplifier circuit coupled to the primary global bit line;

a redundant primary global bit line;

a plurality of subarray bit lines;

a plurality of redundant access devices connected to the plurality of redundant subarray bit lines and the redundant primary global bit line;

a second sense amplifier circuit coupled to the redundant primary global bit line; and a redundant logic control circuit coupled to the redundant primary global bit line for activating the redundant primary global bit line.

47. The integrated memory device of claim 46, in which the primary bit lines comprise global bit lines and subarray bit lines.

48. The integrated memory device of claim 46, in which the redundant bit lines comprise global bit lines and subarray bit lines.

49. The integrated memory device of claim 46, in which the redundant control logic circuitry activates the redundant bit lines in response to an address of one of the primary bit lines.

* * * * *

UNITED STATES PATENT AND TRADEMARK OFFICE
CERTIFICATE OF CORRECTION

PATENT NO. : 5,734,620

DATED : March 31, 1998

INVENTOR(S) : Mirmajid Seyyedy et al.

It is certified that error appears in the above-identified patent and that said Letters Patent is hereby corrected as shown below:

On the title page item,
[75] Inventor, please delete "Mir Majid" and insert --Mirmajid--.

Col. 18, line 16, after "signal" please insert --with:--.

Col. 19, line 35, after "corresponding" please insert --to--.

Col. 21, line 54, please delete "of all activated" and insert --of an activated--.

Col. 25, line 33, please delete "claim 21" and insert --claim 25--.

Col. 26, line 65, please delete "corresponding of" and insert --corresponding one of --.

Col. 28, line 38, please delete "of a secondary" and insert --of secondary--.

Col. 31, line 15, please delete "corresponding said" and insert --corresponding to said--.

Col. 32, line 66, please delete "corresponding said" and insert --corresponding to said--.

Col. 33, line 12, please delete "plurality primary" and insert --plurality of primary--.

UNITED STATES PATENT AND TRADEMARK OFFICE
CERTIFICATE OF CORRECTION

PATENT NO. : 5,734,620

DATED : March 31, 1998

INVENTOR(S) : Mirmajid Seyyedy et al.

It is certified that error appears in the above-identified patent and that said Letters Patent is hereby corrected as shown below:

Col. 34, lines 35-36, please delete "said primary plurality of subarray bit line." and insert --said plurality of primary subarray bit lines.--.

Col. 34, line 61, please delete "corresponding said" and insert --corresponding to said--.

Col. 36, line 61, please delete "corresponding said" and insert --corresponding to said--.

Signed and Sealed this

Tenth Day of November 1998

Attest:

BRUCE LEHMAN

*Attesting Officer*      *Commissioner of Patents and Trademarks*

UNITED STATES PATENT AND TRADEMARK OFFICE
CERTIFICATE OF CORRECTION

| | |
|---|---|
| PATENT NO. : 5,734,620 | |
| DATED : March 31, 1998 | |
| INVENTOR(S) : Seyyedy | |

It is certified that error appears in the above-identified patent and that said Letters Patent is hereby corrected as shown below:

Column 1,
After the Title, insert

-- GOVERNMENT RIGHTS
    This invention was made with United States Government support under contract No. MDA972-94-C-0006 awarded by the Advanced Research Projects Agency (ARPA). The United States Government has certain rights in this invention. --.

Signed and Sealed this

Twenty-fifth Day of September, 2001

*Attest:*

*Attesting Officer*

NICHOLAS P. GODICI
*Acting Director of the United States Patent and Trademark Office*